US012685221B2

(12) United States Patent
So et al.

(10) Patent No.: US 12,685,221 B2
(45) Date of Patent: Jul. 14, 2026

(54) DISPLAY DEVICE WITH OFFSET LOWER ELECTRODES OF DIFFERENT LENGTHS

(71) Applicant: Samsung Display Co., LTD., Yongin-si (KR)

(72) Inventors: Myeong Su So, Seoul (KR); Myeong Hee Kim, Yongin-si (KR); Seul Ki Kim, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 749 days.

(21) Appl. No.: 17/940,260

(22) Filed: Sep. 8, 2022

(65) Prior Publication Data

US 2023/0260980 A1     Aug. 17, 2023

(30) Foreign Application Priority Data

Jan. 24, 2022     (KR) ........................ 10-2022-0010049

(51) Int. Cl.
H10W 90/00          (2026.01)
H10D 86/40          (2025.01)
          (Continued)

(52) U.S. Cl.
CPC .......... H10W 90/00 (2026.01); H10D 86/441 (2025.01); H10D 86/451 (2025.01); H10D 86/60 (2025.01); H10H 20/83 (2025.01); H10H 20/857 (2025.01); H10H 20/01 (2025.01); H10H 20/819 (2025.01); H10W 70/60 (2026.01); H10W 70/6528 (2026.01);
          (Continued)

(58) Field of Classification Search
CPC ............... H10H 20/83; H10H 29/8325; H10H 29/8321; H10H 29/832; H10H 29/39; H10D 30/6729; H10D 30/673; H10D 30/6733; H10D 86/441; H10D 86/60; H10L 25/167; H01L 25/167
See application file for complete search history.

(56) References Cited

U.S. PATENT DOCUMENTS 12,476,233 B2    11/2025  Lee
2017/0054029 A1*   2/2017  Koezuka ................ H10D 99/00
                              (Continued)

FOREIGN PATENT DOCUMENTS

EP          4 213 206          7/2023
KR    10-2021-0151285 A        12/2021
                (Continued)

*Primary Examiner* — Davienne N Monbleau
*Assistant Examiner* — Heim Kirin Grewal
(74) *Attorney, Agent, or Firm* — Womble Bond Dickinson (US) LLP

(57)          ABSTRACT

A display device includes a first electrode and a second electrode disposed on a substrate, the first and second electrodes being spaced apart from each other with a spaced area disposed between the first and second electrodes, an insulating layer disposed on the first electrode and the second electrode, the insulating layer filling the spaced area, and a light emitting element disposed on the insulating layer and having a first end disposed on the first electrode and a second end opposite to the first end. The insulating layer includes a first opening adjacent to the first end and exposing the insulating layer, and the spaced area is adjacent to the second end of the light emitting element.

19 Claims, 16 Drawing Sheets

(51) Int. Cl.

| | | |
|---|---|---|
| *H10D 86/60* | (2025.01) | |
| *H10H 20/01* | (2025.01) | |
| *H10H 20/819* | (2025.01) | |
| *H10H 20/83* | (2025.01) | |
| *H10H 20/857* | (2025.01) | |
| *H10W 70/60* | (2026.01) | |
| *H10W 70/652* | (2026.01) | |
| *H10W 70/654* | (2026.01) | |
| *H10W 72/00* | (2026.01) | |
| *H10W 90/10* | (2026.01) | |
| *H10W 90/22* | (2026.01) | |

(52) U.S. Cl.
CPC ...... *H10W 70/654* (2026.01); *H10W 72/0198* (2026.01); *H10W 90/10* (2026.01); *H10W 90/22* (2026.01)

(56) References Cited

U.S. PATENT DOCUMENTS

| | | | |
|---|---|---|---|
| 2020/0168777 A1* | 5/2020 | Kang ................... | H10H 29/142 |
| 2020/0411492 A1* | 12/2020 | Ju ........................ | H10H 20/857 |
| 2021/0265329 A1* | 8/2021 | Woo .................... | H10H 20/857 |
| 2021/0359049 A1* | 11/2021 | Heo .................... | H01L 25/0753 |
| 2021/0399040 A1* | 12/2021 | Chai ...................... | H10H 29/49 |
| 2022/0393071 A1* | 12/2022 | Moon ............... | H10H 20/8316 |
| 2023/0062301 A1 | 3/2023 | Kim et al. | |
| 2023/0231097 A1 | 7/2023 | So et al. | |
| 2025/0040297 A1* | 1/2025 | Wu ........................ | H10H 29/03 |

FOREIGN PATENT DOCUMENTS

| | | |
|---|---|---|
| KR | 2023-0033218 | 3/2023 |
| KR | 10-2023-0111697 | 7/2023 |

* cited by examiner

NDA

10

DPA

DR1

DR2

RME: RME1, RME2
CNE: CNE1, CNE2

RME: RME1, RME2
CNE: CNE1, CNE2

10_1

RME: RME1, RME2
CNE: CNE1, CNE2

DR3

RME: RME1, RME2
CNE: CNE1, CNE2

RME: RME1, RME2
CNE: CNE1, CNE2

DISPLAY DEVICE WITH OFFSET LOWER ELECTRODES OF DIFFERENT LENGTHS

CROSS-REFERENCE TO RELATED APPLICATION

This application claims priority to and benefit of Korean Patent Application No. 10-2022-0010049 under 35 U.S.C. § 119, filed on Jan. 24, 2022, in the Korean Intellectual Property Office (KIPO), the disclosure of which is incorporated by reference herein in its entirety.

BACKGROUND

1. Technical Field

The disclosure relates to a display device.

2. Description of the Related Art

With the advancement of the information age, the demand for a display device for displaying an image has increased with various forms. The display device may be a flat panel display device such as a liquid crystal display device, a field emission display device and a light emitting display panel. The light emitting display device may include an organic light emitting display device including an organic light emitting diode element as a light emitting element, an inorganic light emitting display device including an inorganic semiconductor element as a light emitting element, or a micro light emitting diode device including a micro light emitting diode as a light emitting element.

SUMMARY

An object of the disclosure is to provide a display device having improved light emitting efficiency.

The objects of the disclosure are not limited to those mentioned above and additional objects of the disclosure, which are not mentioned herein, will be clearly understood by those skilled in the art from the following description of the disclosure.

According to an embodiment of the disclosure, a display device may include a first electrode and a second electrode disposed on a substrate, the first electrode and the second electrode being spaced apart from each other with a spaced area disposed between the first electrode and the second electrode, an insulating layer disposed on the first electrode and the second electrode, the insulating layer filling the spaced area, and a light emitting element disposed on the insulating layer and having a first end disposed on the first electrode and a second end opposite to the first end. The insulating layer may include a first opening adjacent to the first end and exposing the insulating layer, and the spaced area may be disposed to be adjacent to the second end of the light emitting element.

In an embodiment, the display device may further include a floating electrode disposed between the substrate and the first electrode in a thickness direction of the substrate and electrically floated.

In an embodiment, the floating electrode may overlap the spaced area in the thickness direction of the substrate.

In an embodiment, the light emitting element may include an N-type semiconductor layer, a P-type semiconductor layer, and a light emitting layer disposed between the N-type semiconductor layer and the P-type semiconductor layer.

The N-type semiconductor layer may be disposed on the second end of the light emitting element.

In an embodiment, the first electrode may overlap a central portion of the light emitting element in a thickness direction of the substrate.

In an embodiment, the second end of the light emitting element may not overlap the second electrode in a thickness direction of the substrate.

In an embodiment, the second end of the light emitting element may overlap the first electrode in the thickness direction of the substrate.

In an embodiment, the second end of the light emitting element may overlap the spaced area in the thickness direction of the substrate.

In an embodiment, the first opening may expose an upper surface of the insulating layer.

In an embodiment, the first opening may expose a side of the insulating layer and the first electrode.

In an embodiment, the display device may further include a first bank pattern disposed between the substrate and the first electrode, and a second bank pattern disposed between the substrate and the second electrode. The spaced area may expose a portion of the second bank pattern, and the insulating layer may be in contact with the exposed second bank pattern.

In an embodiment, an end of the second electrode may be disposed on the second bank pattern.

In an embodiment, the display device may further include a first connection electrode that is in electrical contact with the first end of the light emitting element on the insulating layer, and a second connection electrode that is in electrical contact with the second end of the light emitting element on the insulating layer.

In an embodiment, a portion of the second connection electrode may overlap a portion of the first electrode in a thickness direction of the substrate.

In an embodiment, the insulating layer may further include a second opening exposing an upper surface of the second electrode. The second connection electrode may be in electrical contact with the exposed upper surface of the second electrode.

In an embodiment, the insulating layer may further include a third opening exposing an upper surface of the first electrode. The first connection electrode may be in electrical contact with the exposed upper surface of the first electrode.

In an embodiment, a portion of the first electrode may overlap a portion of the second electrode in a thickness direction of the substrate.

According to an embodiment of the disclosure, a display device may include a first electrode and a second electrode disposed to be spaced apart from each other on a substrate, an insulating layer disposed on the first electrode and the second electrode, and a light emitting element disposed on the insulating layer and having a first end disposed on the first electrode and a second end opposite to the first end. The insulating layer may include a first opening adjacent to the first end and exposing the insulating layer, and a distance between the first end of the light emitting element and an end of the first electrode in a plan view may be longer than a distance between the second end of the light emitting element and the end of the first electrode in a plan view.

In an embodiment, the display device may further include a first bank pattern disposed between the substrate and the first electrode, and a second bank pattern disposed between the substrate and the second electrode. An end of the second electrode may be disposed on the second bank pattern.

In an embodiment, a shortest distance between the substrate and the first electrode may be shorter than a shortest distance between the substrate and the second electrode.

The display device according to the embodiments of the disclosure may include a first electrode and a second electrode for forming an electric field for aligning a light emitting element. Since the first electrode and the second electrode are disposed toward a side and spaced apart from each other, loss of light emitted to a lower direction of the light emitting element may be reduced and light emitting efficiency in an upper direction may be improved.

The effects according to the embodiments of the disclosure are not limited to those mentioned above and more various effects are included in the following description of the disclosure.

BRIEF DESCRIPTION OF THE DRAWINGS

The disclosure will now be described more fully hereinafter with reference to the accompanying drawings, in which embodiments of the disclosure are shown. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Also, when an element is referred to as being "in contact" or "contacted" or the like to another element, the element may be in "electrical contact" or in "physical contact" with another element; or in "indirect contact" or in "direct contact" with another element.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 1:
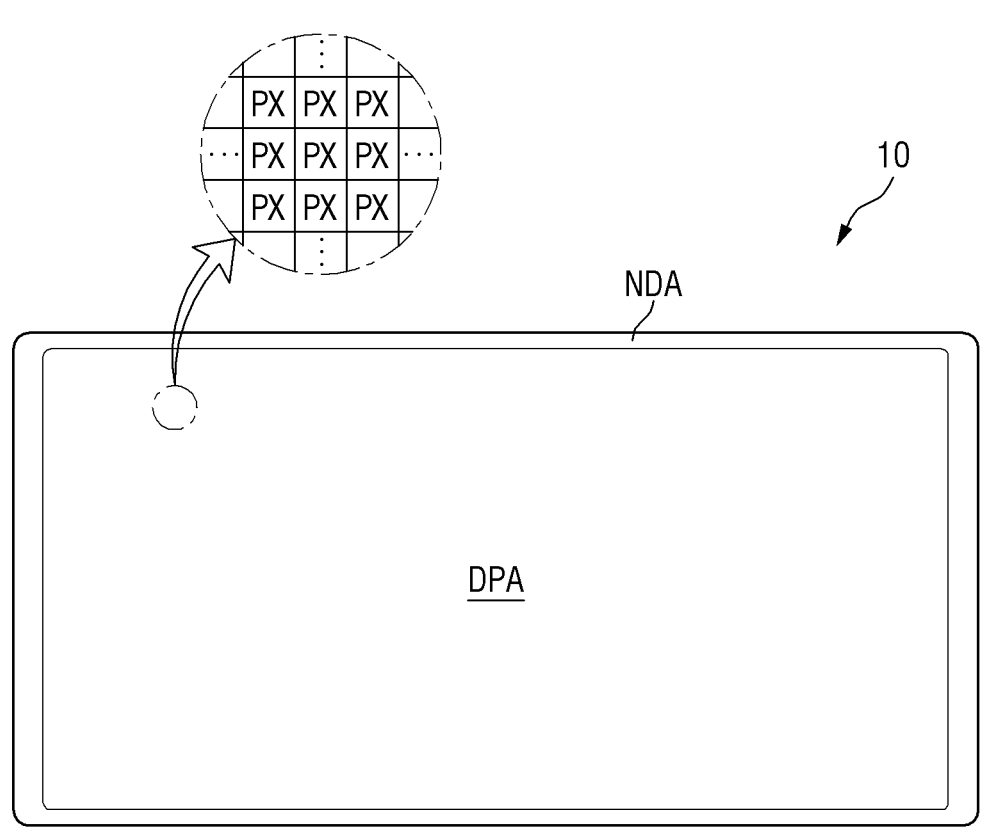
Figure 1:
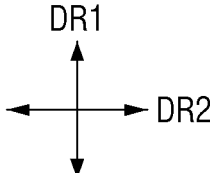
Figure 2:
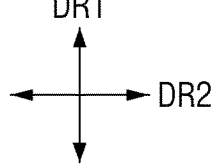
Figure 3:
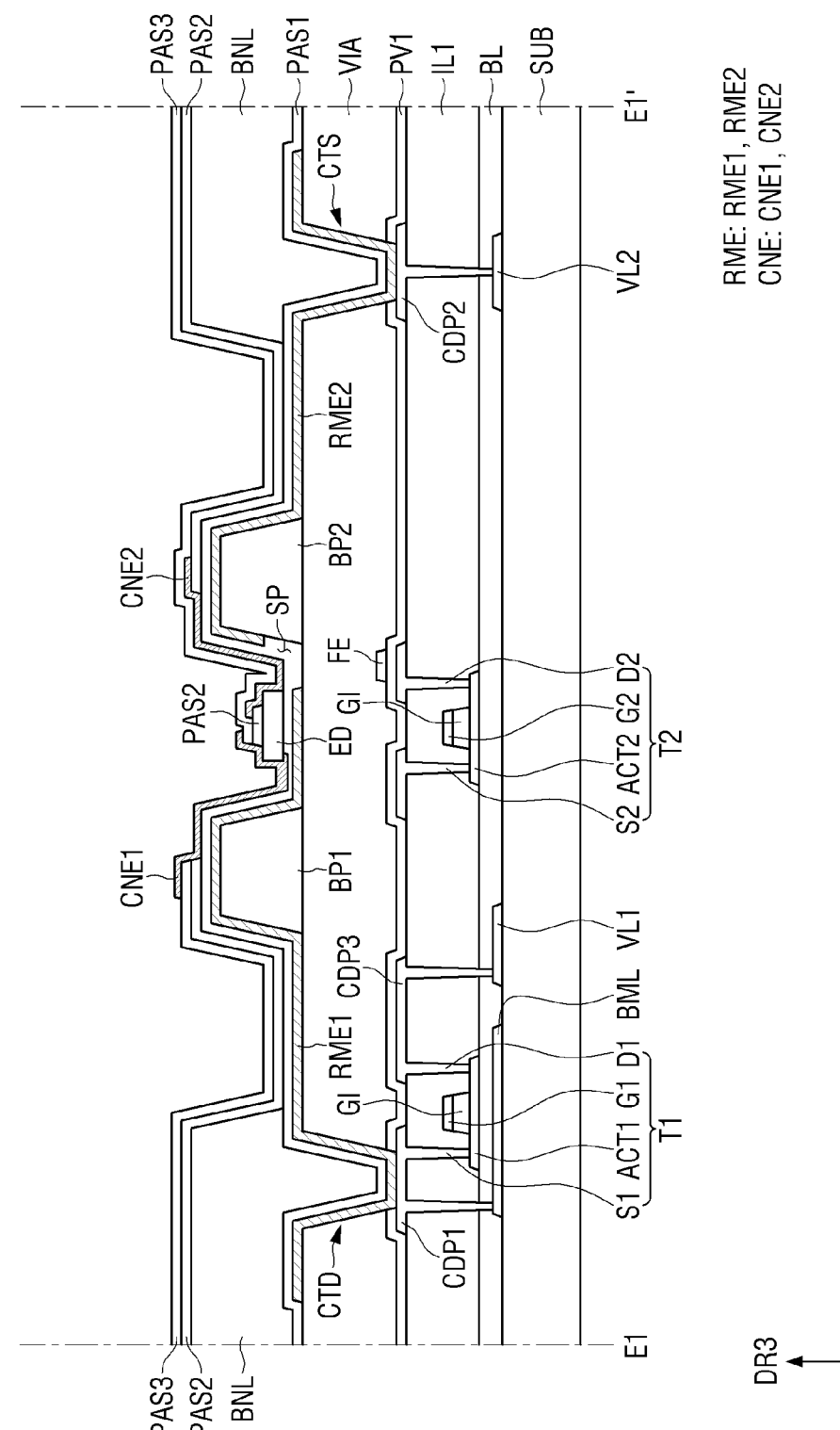
Figure 4:
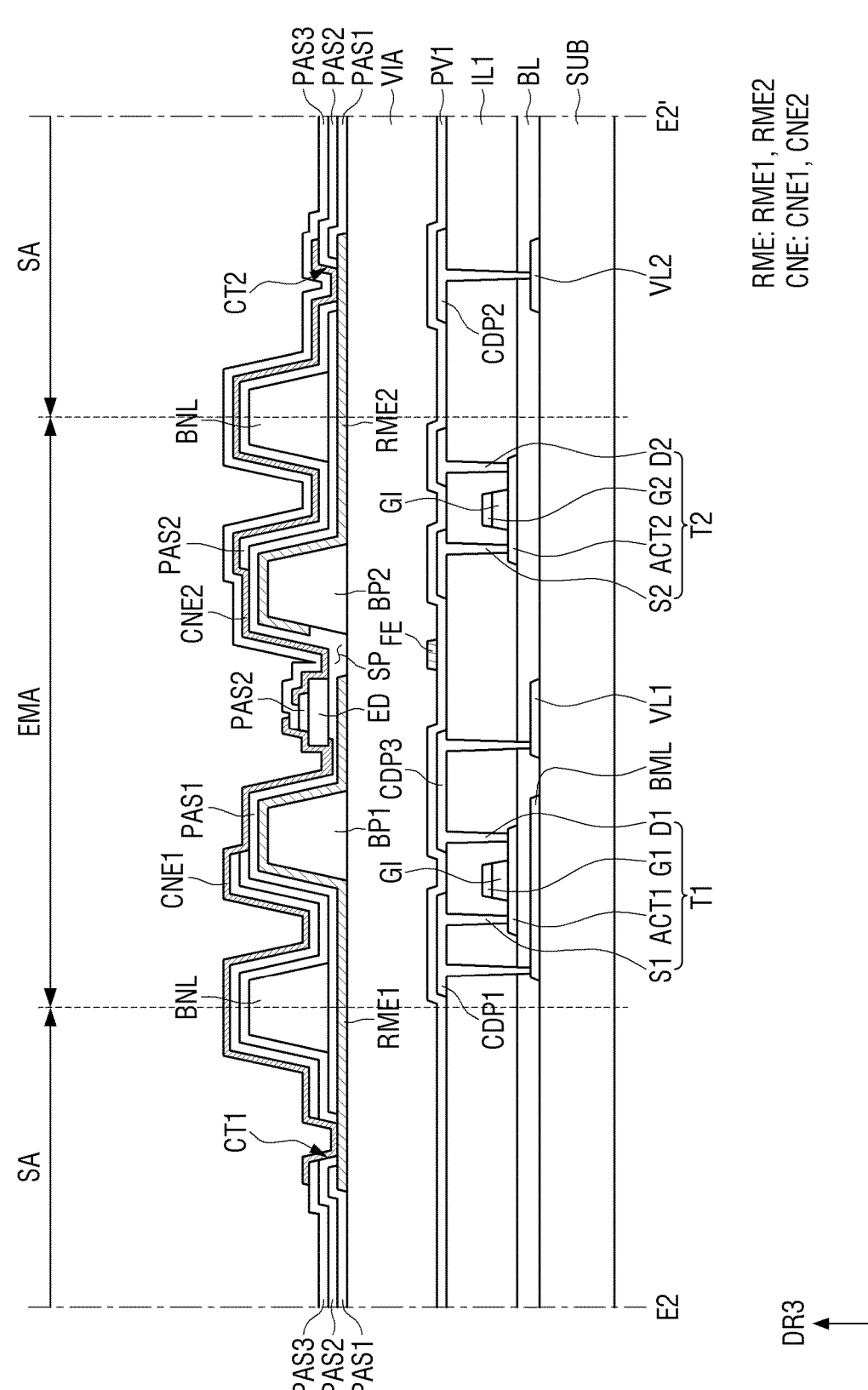
Figure 5:
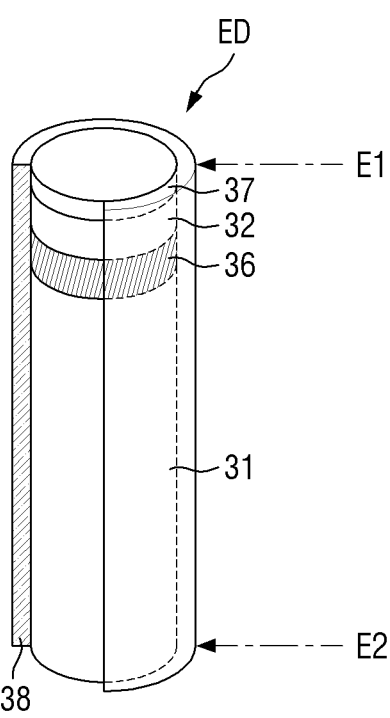
Figure 6:
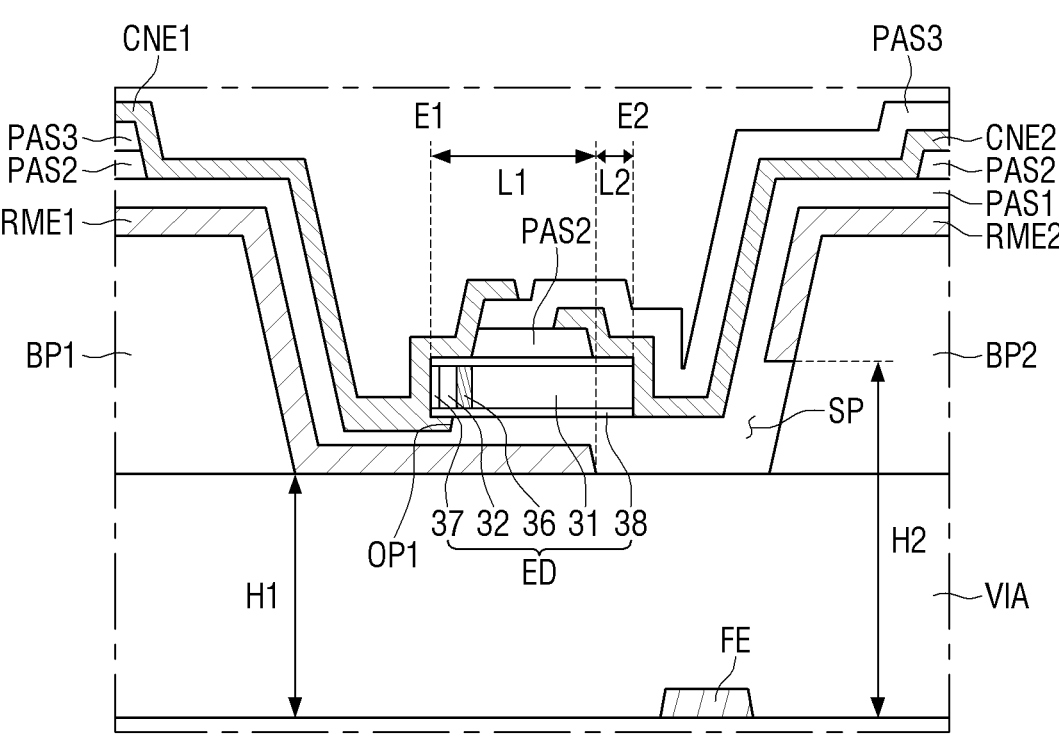
Figure 6:
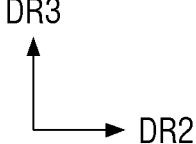
Figure 7:
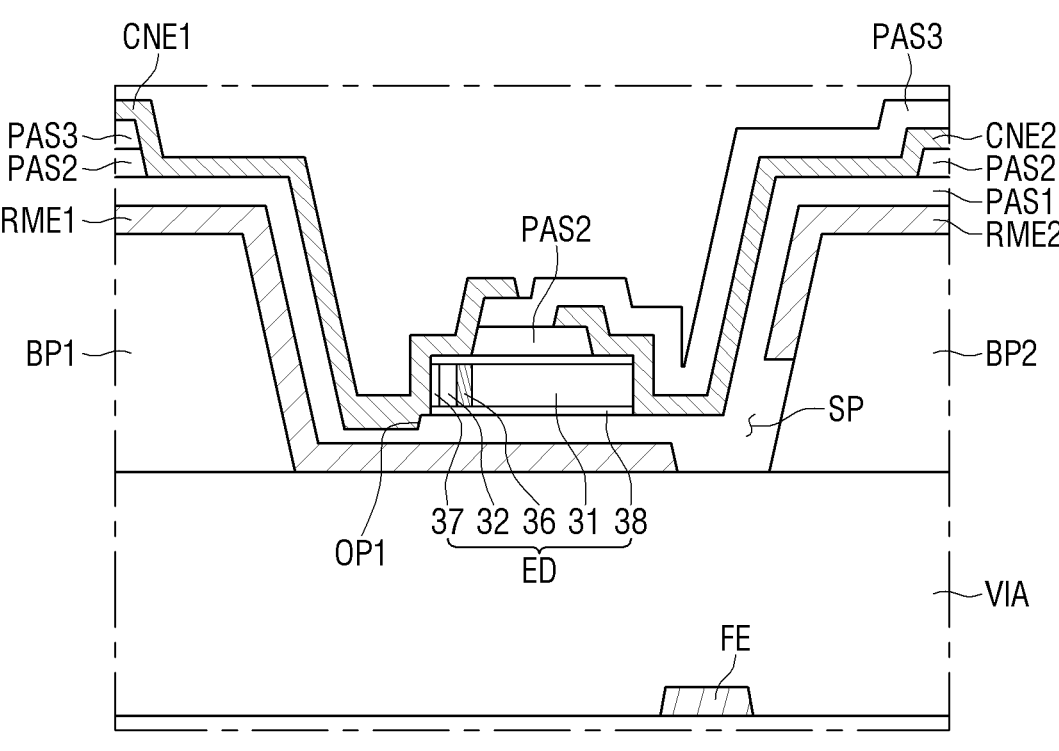
Figure 7:
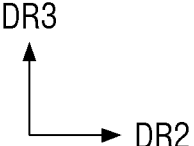
Figure 8:
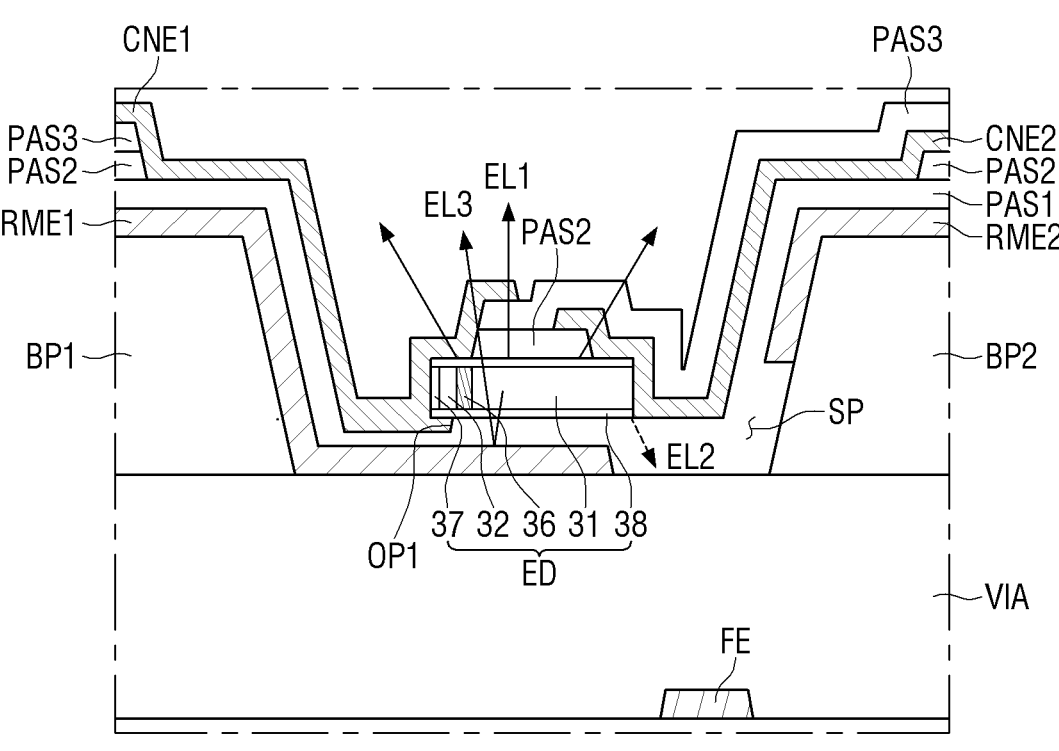
Figure 8:
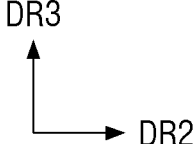
Figure 9:
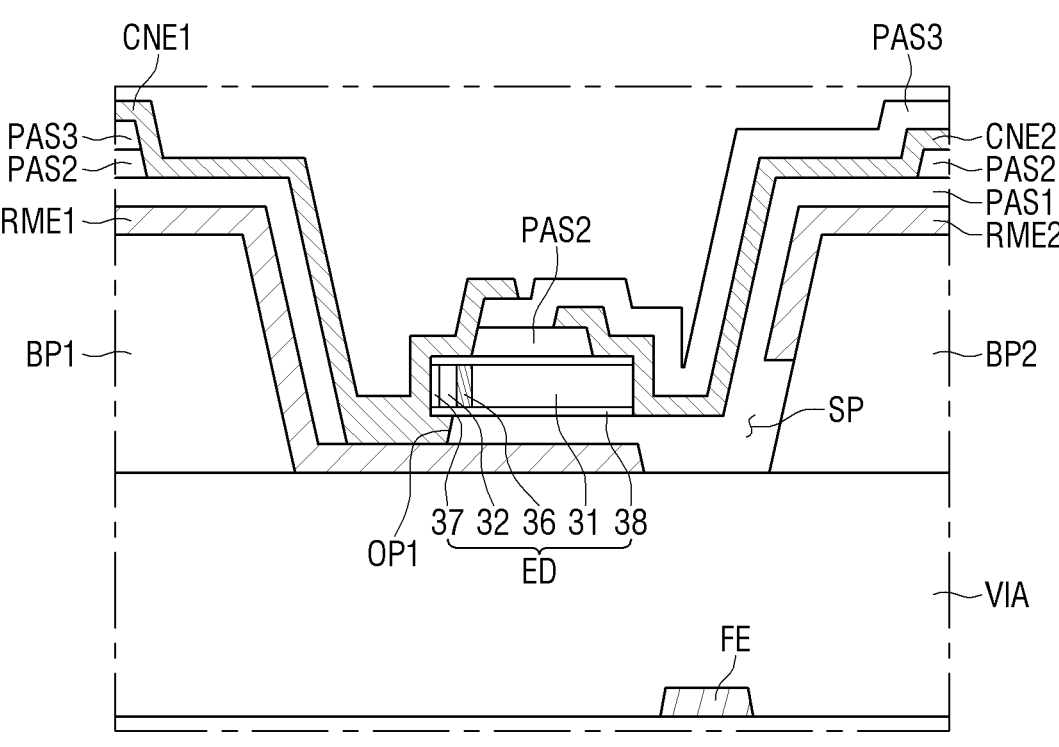
Figure 9:
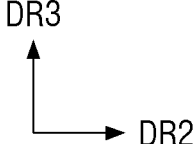
Figure 10:
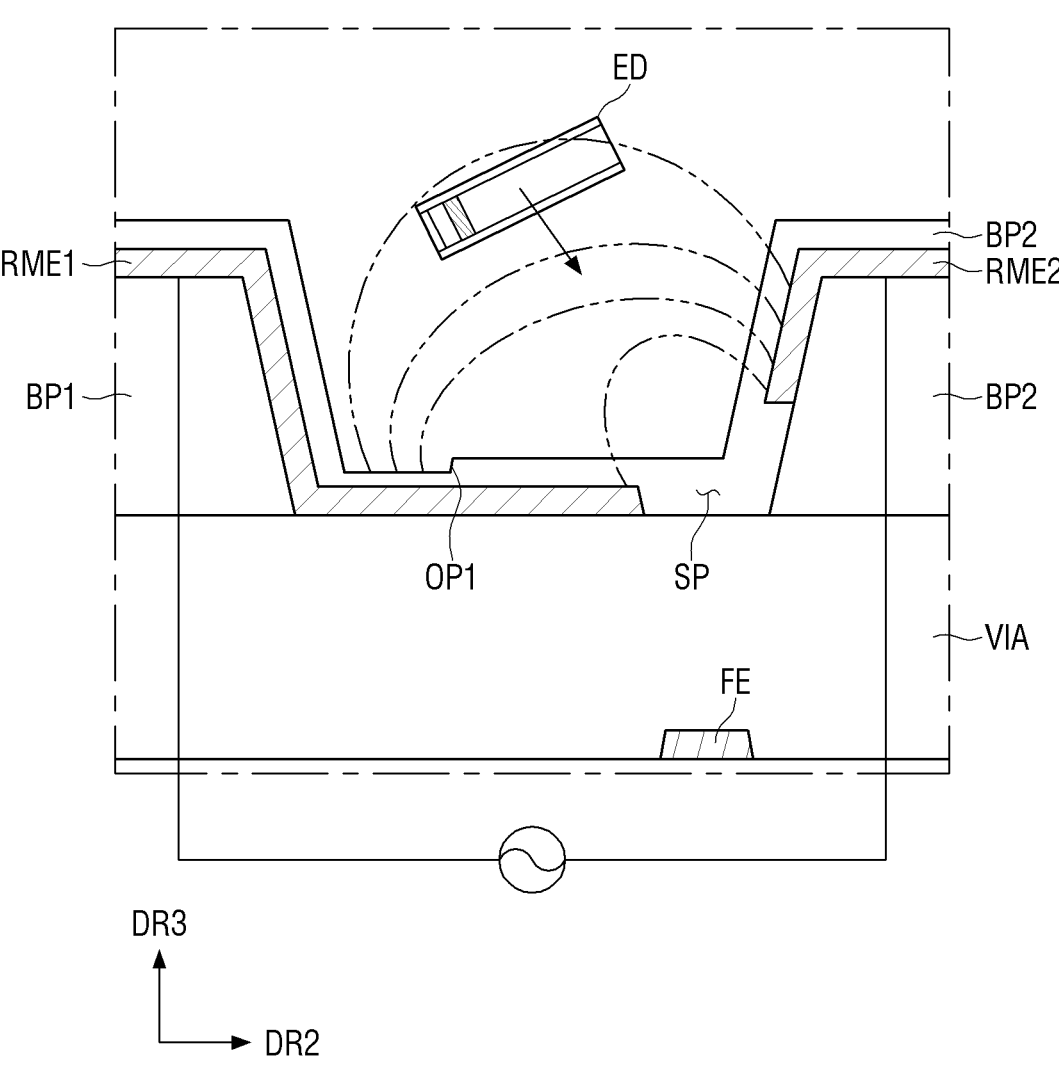
Figure 11:
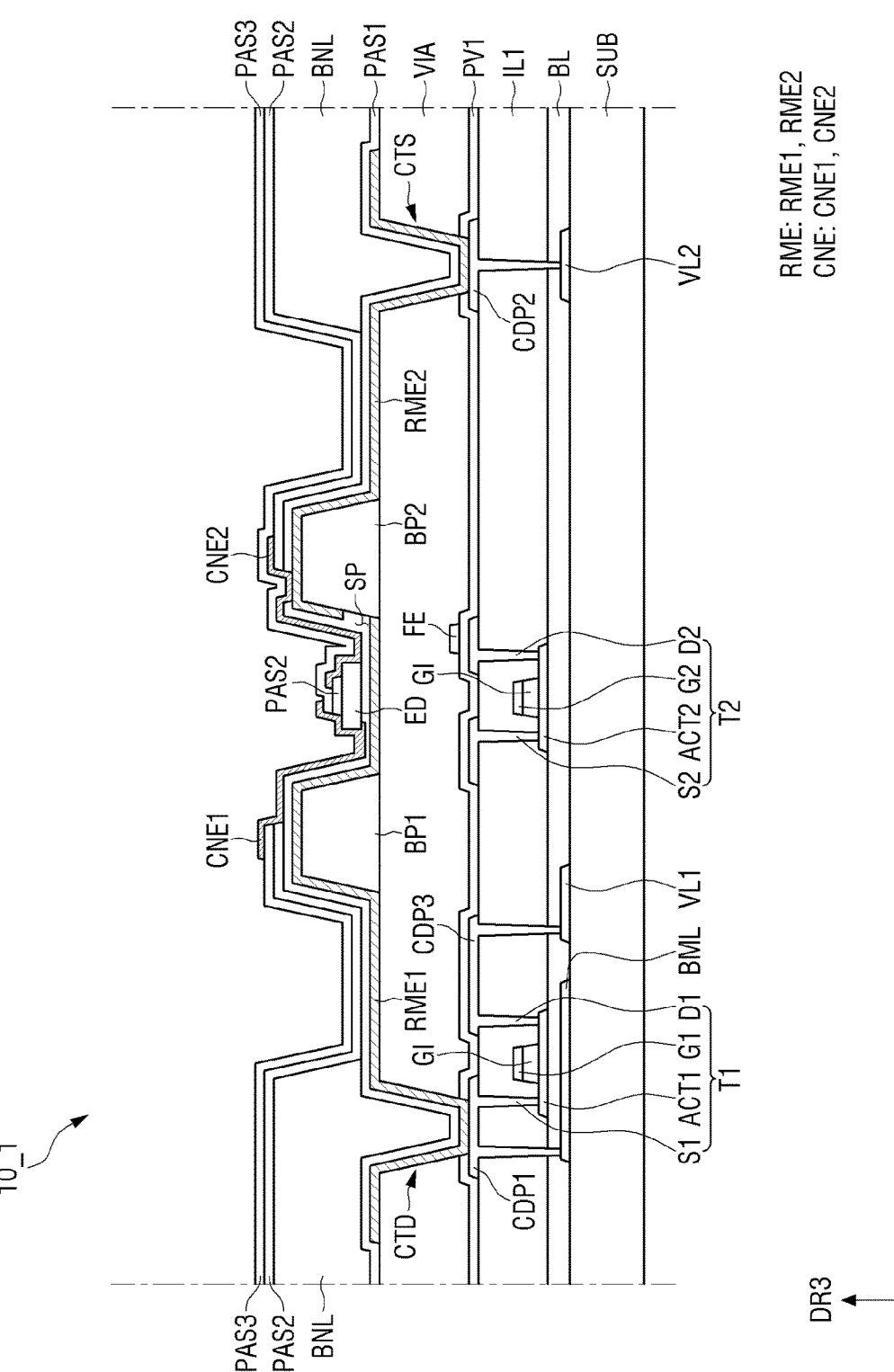
Figure 12:
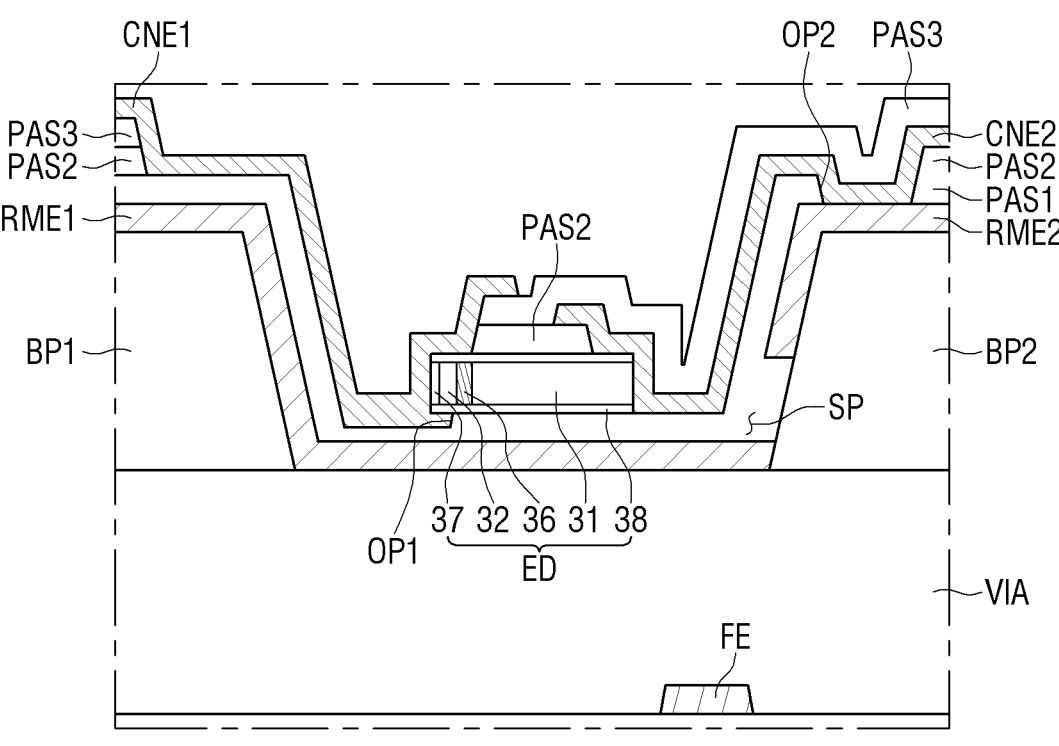
Figure 12:
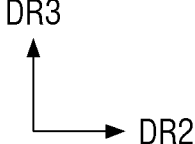
Figure 13:
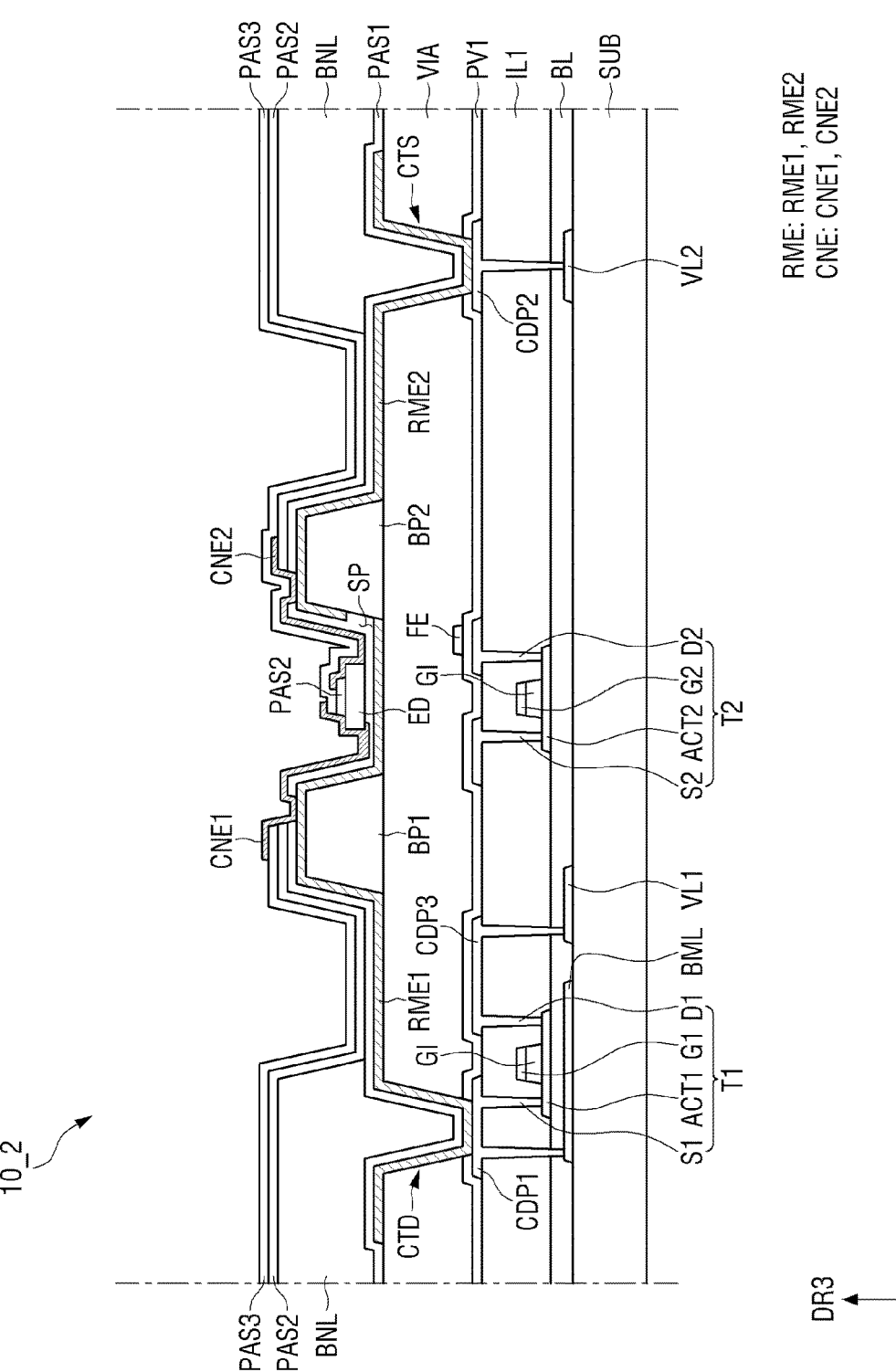
Figure 14:
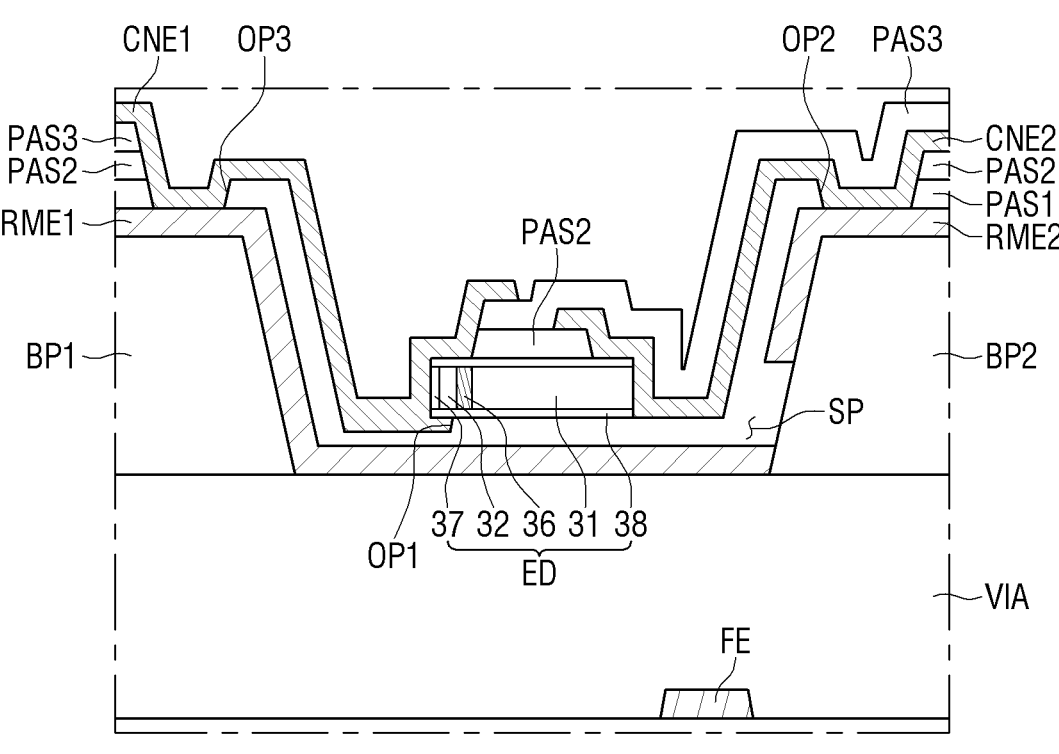
Figure 14:
Figure 15:
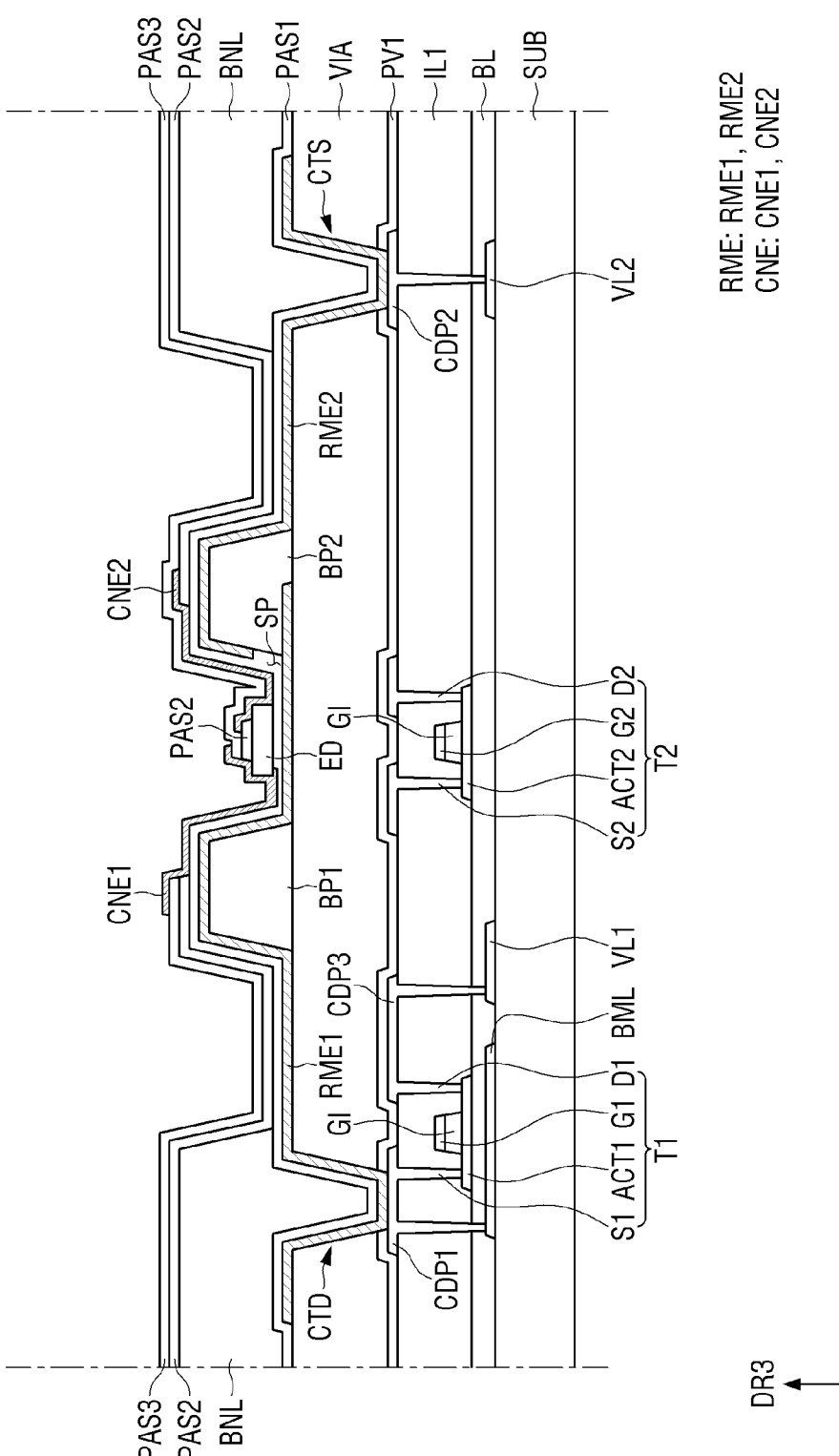
Figure 16:
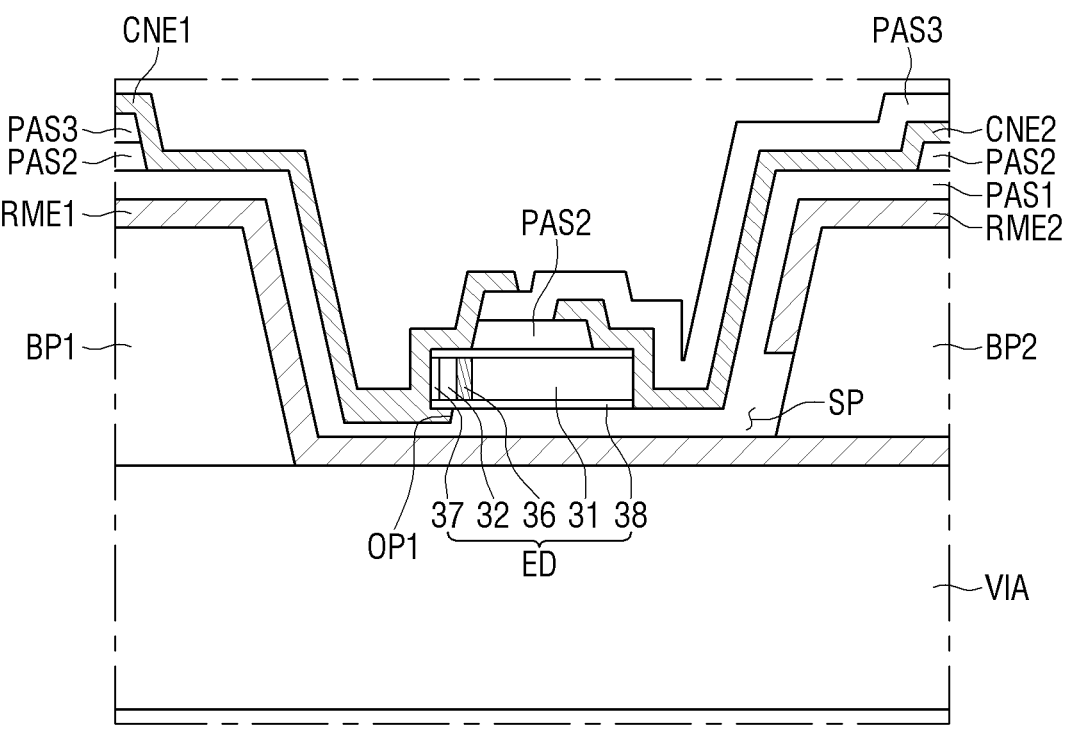
Figure 16:

The above and other aspects and features of the disclosure will become more apparent by describing in detail embodiments thereof with reference to the attached drawings, in which:

FIG. 1 is a schematic plan view illustrating a display device according to an embodiment of the disclosure;

FIG. 2 is a plan view illustrating a pixel of a display device according to an embodiment of the disclosure;

FIG. 3 is a schematic cross-sectional view taken along line E1-E1' of FIG. 2;

FIG. 4 is a schematic cross-sectional view taken along line E2-E2' of FIG. 2;

FIG. 5 is a schematic view illustrating a light emitting element according to an embodiment of the disclosure;

FIG. 6 is an enlarged schematic cross-sectional view illustrating a portion where a light emitting element is disposed in an embodiment of the disclosure;

FIG. 7 is enlarged schematic cross-sectional view illustrating a portion where a light emitting element is disposed in another embodiment of the disclosure;

FIG. 8 is a schematic cross-sectional view illustrating a light emitting direction of a light emitting element in an embodiment of the disclosure;

FIG. 9 is enlarged schematic cross-sectional view illustrating a portion where a light emitting element is disposed in another embodiment of the disclosure;

FIG. 10 is a schematic cross-sectional view illustrating a process of aligning a light emitting element and an electric field, which are formed in first and second electrodes in an embodiment of the disclosure;

FIG. 11 is a schematic cross-sectional view illustrating a display device according to another embodiment of the disclosure;

FIG. 12 is an enlarged schematic cross-sectional view illustrating a portion where a light emitting element is disposed in another embodiment of the disclosure;

FIG. 13 is a schematic cross-sectional view illustrating a display device according to still another embodiment of the disclosure;

FIG. 14 is an enlarged cross-sectional view illustrating a portion where a light emitting element is disposed in still another embodiment of the disclosure;

FIG. 15 is a schematic cross-sectional view illustrating a display device according to further still another embodiment of the disclosure; and FIG. 16 is an enlarged schematic cross-sectional view illustrating a portion where a light emitting element is disposed in further still another embodiment of the disclosure.

DETAILED DESCRIPTION OF THE EMBODIMENTS

Hereinafter, detailed embodiments of the disclosure will be described with reference to the accompanying drawings.

FIG. 1 is a schematic plan view illustrating a display device according to an embodiment of the disclosure.

Referring to FIG. 1, a display device 10 may display a moving image or a still image. The display device 10 may include all electronic devices that provide a display screen. For example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like, which provide a display screen, may be included in the display device 10.

The display device 10 may include a display panel for providing a display screen. Examples of the display panel may include an inorganic light emitting diode display panel, an organic light emitting display panel, a quantum dot light emitting display panel, a plasma display panel, and a field emission display panel. Hereinafter, an inorganic light emitting diode display panel is applied as an embodiment of a display panel, but the disclosure is not limited thereto. Another type of display panel may be used in case that the same technical spirits are applicable thereto.

Various modifications may be made in a shape of the display device 10. For example, the display device 10 may have a rectangular shape that is long in a horizontal direction, a rectangular shape that is long in a vertical direction, a square shape, a square shape with rounded corners (vertexes), other polygonal shape, a circular shape, etc. A shape of a display area DPA of the display device 10 may also be similar to the overall shape of the display device 10. In FIG. 1, a rectangular display device 10 that is longer in a second direction DR2 is illustrated in FIG. 1.

The display device 10 may include a display area DPA and a non-display area NDA. The display area DPA may be an area in which a screen may be displayed and the non-display area NDA may be an area in which a screen is not displayed. The display area DPA may be referred to as an active area and the non-display area NDA may be referred to as a non-active area. The display area DPA may generally occupy the center of the display device 10.

The display area DPA may include multiple pixels PX. The pixels PX may be disposed in a matrix direction. A shape of each pixel PX may be a rectangular or square shape in a plan view, but is not limited thereto. The shape of each pixel PX may be a rhombus shape in which each side is inclined with respect to one direction. The respective pixels PX may be disposed in a stripe type or an island type. Also, each of the pixels PX may include one or more light emitting elements for emitting light of a specific wavelength band to display a specific color.

The non-display area NDA may be disposed in the vicinity of the display area DPA. The non-display area NDA may fully or partially surround the display area DPA. The display area DPA may be rectangular in shape and the non-display area NDA may be disposed to be adjacent to four sides of the display area DPA. The non-display area NDA may constitute a bezel of the display device 10. Lines or circuit drivers included in the display device 10 may be disposed in the non-display areas NDA or external devices may be packaged therein.

FIG. 2 is a plan view illustrating a pixel of a display device according to an embodiment of the disclosure.

FIG. 2 illustrates a planar arrangement of electrodes RME (RME1 and RME2), bank patterns BP1 and BP2, a bank layer BNL, multiple light emitting elements ED and connection electrode CNE (CNE1 and CNE2), which are disposed in a pixel PX of the display device 10.

Referring to FIG. 2, each of the pixels PX of the display device 10 may include multiple subpixels SPXn. For example, a pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red, but the disclosure is not limited thereto. The respective subpixels SPXn may emit light of the same color. Although FIG. 2 illustrates that a pixel PX includes three subpixels SPXn, the disclosure is not limited thereto, and the pixel PX may include more than three subpixels.

Each subpixel SPXn of the display device 10 may include a light emission area EMA and a non-light emission area. The light emission area EMA may be an area in which a light emitting element ED is disposed to emit light of a specific wavelength band. The non-light emission area may be an area where the light emitting element ED is not disposed and light emitted from the light emitting element ED does not reach there so that the light is not emitted.

The light emission area EMA may include an area in which the light emitting element ED is disposed and an area of which the light emitted from the light emitting element ED is emitted to that is adjacent to the light emitting element ED. For example, the light emission area EMA may include an area where the light emitted from the light emitting element ED is reflected or refracted by another member. The light emitting elements ED may be disposed in the respective subpixels SPXn, and the light emission area EMA may include an area in which the subpixels are disposed and an area adjacent to the area as described above.

The light emission areas EMA of the respective subpixels SPXn are shown as having a uniform size in FIG. 2, but are not limited thereto. In some embodiments, each light emission area EMA of each subpixel SPXn may have a different size depending on the color or wavelength band of the light emitted from the light emitting element ED disposed in the corresponding subpixel SPXn.

Each subpixel SPXn may also include a sub-area SA disposed in the non-emission area. The sub-area SA of the corresponding subpixel SPXn may be disposed at a lower side of the light emission area EMA in a first direction DR1. The light emission area EMA and the sub-area SA may be alternately disposed along the first direction DR1, and the sub-area SA may be disposed between light emission areas EMA of different subpixels SPXn spaced apart from each other in the first direction DR1. For example, the light emission area EMA and the sub-area SA may be alternately disposed in the first direction DR1 and may be repeatedly disposed in a second direction DR2, but are not limited thereto. The light emission areas EMA and the sub-areas SA in the pixels PX may have an arrangement different from that of FIG. 2.

As the light emitting element ED is not disposed in the sub-area SA, light is not emitted from the sub-area SA, but a portion of the electrodes RME disposed in the respective subpixels SPXn may be disposed in the sub-area SA. The electrodes RME disposed in different subpixels SPXn may be spaced apart from each other by a partition portion ROP in the sub-area SA.

The display device 10 may include multiple electrodes RME (RME1 and RME2), bank patterns BP1 and BP2, a bank layer BNL, light emitting elements ED, and connection electrodes CNE (CNE1 and CNE2).

Multiple bank patterns BP1 and BP2 may be disposed in the light emission area EMA of each subpixel SPXn. The bank patterns BP1 and BP2 may have a predetermined (or selectable) width in the second direction DR2 and may have a shape extended in the first direction DR1.

For example, the bank patterns BP1 and BP2 may include a first bank pattern BP1 and a second bank pattern BP2, which are spaced apart from each other in the second direction DR2 in the light emission area EMA of each subpixel SPXn. The first bank pattern BP1 may be disposed on a left side in the second direction DR2 from the center of the light emission area EMA in a plan view, and the second bank patterns BP2 may be disposed on a right side in the second direction DR2 from the center of the light emission area EMA in a plan view by being spaced apart from the first bank pattern BP1. The first bank pattern BP1 and the second bank pattern BP2 may be alternately disposed along the second direction DR2 and may be disposed in the display area DPA in an island shaped pattern. Multiple light emitting elements ED may be disposed between the first bank pattern BP1 and the second bank pattern BP2.

The first bank pattern BP1 and the second bank pattern BP2 may have the same length as each other in the first direction DR1, and the length of the first bank pattern BP1 and the second bank pattern BP2 may be shorter than the length of the light emission area EMA, which is surrounded by the bank layer BNL, in the first direction DR1. The first bank pattern BP1 and the second bank pattern BP2 may be spaced apart from a portion of the bank layer BNL, which is extended in the second direction DR2, but are not limited thereto. The bank patterns BP1 and BP2 may be integrated with the bank layer BNL or may partially overlap a portion of the bank layer BNL, which is extended in the second direction DR2. The length of the bank patterns BP1 and BP2 in the first direction DR1 may be the same as or greater than that of the light emission area EMA, which is surrounded by the bank layer BNL, in the first direction DR1.

The widths of the first bank pattern BP1 and the second bank pattern BP2 in the second direction DR2 may be the same, but are not limited thereto. The first bank pattern BP1 and the second bank pattern BP2 may have different widths. For example, one of the bank patterns may have a width greater than that of another bank pattern, and the bank pattern having a greater width may be extended to the light emission areas EMA of adjacent subpixels SPXn in the second direction DR2. The bank pattern extended to another light emission areas EMA in the first direction DR1 may overlap a portion of the bank layer BNL. The bank patterns BP1 and BP2 are illustrated as being disposed with the same width for each subpixel SPXn, but are not limited thereto. The number and shape of the bank patterns BP1 and BP2 may vary depending on the number or arrangement of the electrodes RME.

Multiple electrodes RME (RME1 and RME2) may be disposed in each subpixel SPXn in a shape extended in one direction. The electrodes RME may be extended in the first direction DR1, may be disposed in the light emission area EMA and the sub-area SA of the subpixel SPXn, and may be spaced apart from each another in the second direction DR2. The electrodes RME may be electrically connected to the light emitting element ED, which will be described later, but are not limited thereto. The electrodes RME may not be directly connected to the light emitting element ED.

In an embodiment, the display device 10 may include a first electrode RME1 and a second electrode RME2, which are disposed in each subpixel SPXn. The second electrode RME2 may be disposed on a right side from the center of the light emission area EMA, and the first electrode RME1 may be spaced apart from the second electrode RME2 in the second direction DR2. A portion of the first electrode RME1 may be disposed on a left side from the center of the light emission area EMA and another portion thereof may be disposed on a right side from the center of the light emission area EMA. The first electrode RME1 may have a width greater than that of the second electrode RME2. Therefore, a spaced area between the first electrode RME1 and the second electrode RME2 may be disposed on a right side from the center of the light emission area EMA.

The first electrode RME1 may be disposed on the first bank pattern BP1 and the second electrode RME2 may be disposed on the second bank pattern BP2. The first electrode RME1 and the second electrode RME2 may be disposed in the corresponding subpixel SPXn and the sub-area SA beyond the bank layer BNL. The first electrode RME1 and the second electrode RME2 of a subpixel SPXn may be spaced apart from respective first electrode RME1 and second electrode RME2 of adjacent subpixel SPXn due to the partition portion ROP positioned in the sub-area SA.

Although described later, in case that the light emitting element ED is disposed at the center of the light emission area EMA, the first electrode RME1 may overlap the light emitting element ED, but the second electrode RME2 may not overlap the light emitting element ED.

The two electrodes RME are illustrated as having a shape extended in the first direction DR1 for each subpixel SPXn, but are not limited thereto. For example, the display device 10 may include more than two electrodes RME disposed in one subpixel SPXn or the electrodes RME may be partially bent.

The bank layer BNL may be disposed to surround the light emission area EMA and the sub-area SA of each subpixel SPXn. The bank layer BNL may be disposed at a boundary between adjacent subpixels SPXn in the first direction DR1 and the second direction DR2 and may also be disposed at a boundary between the light emission area EMA and the sub-area SA. The light emission area EMA and the sub-area SA of the display device 10 may be areas partitioned by the arrangement of the bank layer BNL. A distance between the light emission areas EMA and the sub-areas SA may vary depending on the width of the bank layer BNL.

The bank layer BNL may include a portion extended in the first direction DR1 and the second direction DR2 in a plan view and thus may be disposed on an entire surface of the display area DPA in a lattice pattern. The bank layer BNL may be disposed over a boundary of each of the subpixels SPXn to partition the subpixels SPXn adjacent to each other. The bank layer BNL may be disposed to surround the light emission area EMA and the sub-area SA, which are disposed in each subpixel SPXn, thereby partitioning them.

The light emitting elements ED may be disposed in the light emission area EMA. The light emitting elements ED may be disposed between the bank patterns BP1 and BP2 and may be spaced apart from each other in the first direction DR1. In an embodiment, the light emitting elements ED may have a shape extended in one direction. The light emitting elements ED may have a first end corresponding to a left side the second direction DR2 and a second end corresponding to a right side in the second direction DR2. The first end may be disposed on the first electrode RME1, but the second end may be not disposed on the second electrode RME2. The second end may be disposed on the first electrode RME1 or may be disposed on a spaced area ('SP' of FIG. 3) between the first electrode RME1 and the second electrode RME2.

The light emitting elements ED may be extended to be perpendicular to the first direction DR1 in which the electrodes RME are extended, but is not limited thereto. The extended direction of the light emitting elements ED may be the second direction DR2 or an oblique direction with respect to the second direction DR2.

Multiple connection electrodes CNE (CNE1 and CNE2) may be disposed on the electrodes RME and the bank patterns BP1 and BP2. Each of the connection electrodes CNE may have a shape extended in one direction and may be disposed to be spaced apart from another connection electrode. The connection electrodes CNE may be in contact with the respective light emitting element ED and may be electrically connected to the respective electrode RME or the conductive layer.

The connection electrodes CNE may include a first connection electrode CNE1 and a second connection electrode CNE2, which are disposed in each subpixel SPXn. The first connection electrode CNE1 may have a shape extended in the first direction DR1 and may be disposed on the first electrode RME1 or the first bank pattern BP1. The first connection electrode CNE1 may fully overlap the first electrode RME1 and may be extended from the light emission area EMA to the sub-area SA beyond the bank layer BNL. The second connection electrode CNE2 may have a shape extended in the first direction DR1 and may be disposed on the second electrode RME2 or the second bank pattern BP2. The second connection electrode CNE2 may partially overlap the second electrode RME2 and may be extended from the light emission area EMA to the sub-area SA beyond the bank layer BNL.

FIG. 3 is a schematic cross-sectional view taken along line E1-E1' of FIG. 2. FIG. 4 is a schematic cross-sectional view taken along line E2-E2' of FIG. 2. FIG. 3 shows a schematic cross-section crossing both ends of the light emitting element ED and electrode contact holes CTD and CTS, which are disposed in the first subpixel SPX1, and FIG. 4 shows a schematic cross-section crossing both ends of the light emitting element ED and contact portions CT1 and CT2, which are disposed in the first subpixel SPX1.

A cross-sectional structure of the display device 10 will be described with reference to FIGS. 2 to 4. The display device 10 may include a first substrate SUB and a semiconductor layer, multiple conductive layers and multiple insulating layers, which are disposed on the first substrate SUB. The display device 10 may include multiple electrodes RME (RME1 and RME2), light emitting elements ED and connection electrodes CNE (CNE1 and CNE2).

The first substrate SUB may be an insulating substrate. The first substrate SUB may be made of an insulating material such as glass, quartz or polymer resin. The first substrate SUB may be a rigid substrate, or may be a flexible substrate subjected to bending, folding, rolling or the like. The first substrate SUB may include a display area DPA and a non-display area NDA surrounding the display area DPA, and the display area DPA may include a light emission area EMA and a sub-area SA that is a portion of a non-light emission area.

A first conductive layer may be disposed on the first substrate SUB. The first conductive layer may include a lower metal layer BML, a first voltage line VL1 and a second voltage line VL2. The lower metal layer BML may be disposed to overlap a first active layer ACT1 of a first transistor T1. The lower metal layer BML may prevent light from entering the first active layer ACT1 of the first transistor T1 or may be electrically connected to the first active layer ACT1 to stabilize electrical characteristics of the first transistor T1. However, the lower metal layer BML may be omitted.

A high potential voltage (or first power voltage) transferred to the first electrode RME1 may be applied to the first voltage line VL1 and a low potential voltage (or second power voltage) transferred to the second electrode RME2 may be applied to the second voltage line VL2. The first voltage line VL1 may be electrically connected with the first transistor T1 through a conductive pattern (for example, third conductive pattern CDP3) of a third conductive layer. The second voltage line VL2 may be electrically connected with the second electrode RME2 through a conductive pattern (for example, second conductive pattern CDP2) of the third conductive layer.

The first voltage line VL1 and the second voltage line VL2 are illustrated as being disposed on the first conductive layer, but are not limited thereto. In some embodiments, the first voltage line VL1 and the second voltage line VL2 may be disposed on the third conductive layer and directly and electrically connected to the first transistor T1 and the second electrode RME2, respectively.

A buffer layer BL may be disposed on the first conductive layer and the first substrate SUB. The buffer layer BL may be formed on the first substrate SUB to protect the transistors of the pixel PX from moisture permeated through the first substrate SUB vulnerable to moisture permeation and may perform a surface planarization function.

The semiconductor layer may be disposed on the buffer layer BL. The semiconductor layer may include the first active layer ACT1 of the first transistor T1 and a second active layer ACT2 of a second transistor T2. Each of the first active layer ACT1 and the second active layer ACT2 may be disposed to partially overlap a first gate electrode G1 and a second gate electrode G2 of a second conductive layer, which will be described later.

The semiconductor layer may include polycrystalline silicon, monocrystalline silicon, an oxide semiconductor and the like. The oxide semiconductor may be an oxide semiconductor containing indium (In). For example, the oxide semiconductor may be at least one of Indium Tin Oxide (ITO), Indium Zinc Oxide (IZO), Indium Gallium Oxide (IGO), Indium Zinc Tin Oxide (IZTO), Indium Gallium Tin Oxide (IGTO), Indium Gallium Zinc Oxide (IGZO) or Indium Gallium Zinc Tin Oxide (IGZTO).

Although one first transistor T1 is illustrated as being disposed in the subpixel SPXn of the display device 10, the disclosure is not limited thereto. The display device 10 may include more than one transistor.

A first gate insulating layer GI may be disposed on the semiconductor layer in the display area DPA. The first gate insulating layer GI may serve as a gate insulating layer of each of the transistors T1 and T2. The first gate insulating layer GI is illustrated as being patterned along with the gate electrodes G1 and G2 of the second conductive layer, which will be described later, so that the first gate insulating layer GI is partially disposed between the second conductive layer and the active layers ACT1 and ACT2 of the semiconductor layer, but is not limited thereto. In some embodiments, the first gate insulating layer GI may be disposed entirely on the buffer layer BL.

The second conductive layer may be disposed on the first gate insulating layer GI. The second conductive layer may include a first gate electrode G1 of the first transistor T1 and a second gate electrode G2 of the second transistor T2. The first gate electrode G1 may be disposed to overlap a channel area of the first active layer ACT1 in a third direction DR3 that is a thickness direction, and the second gate electrode G2 may be disposed to overlap a channel area of the second active layer ACT2 in the third direction DR3 that is the thickness direction.

A first interlayer insulating layer IL1 may be disposed on the second conductive layer. The first interlayer insulating layer IL1 may serve as an insulating layer between the second conductive layer and other layers disposed on the second conductive layer and may protect the second conductive layer.

The third conductive layer may be disposed on the first interlayer insulating layer IL1. The third conductive layer may include multiple conductive patterns CDP1, CDP2 and CDP3 and source electrodes S1 and S2 and drain electrodes D1 and D2 of the respective transistors T1 and T2. A portion of the conductive patterns CDP1, CDP2 and CDP3 may electrically connect conductive layers or semiconductor layers of different layers with each other and may serve as the source/drain electrodes of the transistors T1 and T2.

The first conductive pattern CDP1 may be in contact with the first active layer ACT1 of the first transistor T1 through a contact hole that passes through the first interlayer insulating layer IL1. The first conductive pattern CDP1 may be in contact with the lower metal layer BML through another contact hole that passes through the first interlayer insulating layer IL1 and the buffer layer BL. The first conductive pattern CDP1 may serve as the first source electrode S1 of the first transistor T1. The first conductive pattern CDP1 may be electrically connected to the first electrode RME1 or the first connection electrode CNE1, which will be described later. The first transistor T1 may transfer the first power voltage applied from the first voltage line VL1 to the first electrode RME1 or the first connection electrode CNE1.

The second conductive pattern CDP2 may be in contact with the second voltage line VL2 through the contact hole that passes through the first interlayer insulating layer IL1 and the buffer layer BL. The second conductive pattern CDP2 may be electrically connected with the first electrode RME1 or the first connection electrode CNE1. The second voltage line VL2 may transfer the second power voltage to the second electrode RME2 or the second connection electrode CNE2.

The third conductive pattern CDP3 may be in contact with the first voltage line VL1 through the contact hole that passes through the first interlayer insulating layer IL1 and the buffer layer BL. Also, the third conductive pattern CDP3 may be in contact with the first active layer ACT1 of the first transistor T1 through the contact hole that passes through the first interlayer insulating layer IL1. The third conductive pattern CDP3 may electrically connect the first voltage line VL1 with the first transistor T1 and serve as the first drain electrode D1 of the first transistor T1.

Each of the second source electrode S2 and the second drain electrode D2 may be in contact with the second active layer ACT2 of the second transistor T2 through the contact hole that passes through the first interlayer insulating layer IL1. The second transistor T2 may transfer a data signal to the first transistor T1 or may transfer an initialization signal.

A first passivation layer PV1 may be disposed on the third conductive layer. The first passivation layer PV1 may serve as an insulating layer between the third conductive layer and other layers and may protect the third conductive layer.

The buffer layer BL, the first gate insulating layer GI, the first interlayer insulating layer IL1, and the first passivation layer PV1 may be formed of multiple inorganic layers that are alternately stacked each other. For example, the buffer layer BL, the first gate insulating layer GI, the first interlayer insulating layer IL1, and the first passivation layer PV1 may be formed of a double layer in which inorganic layers including at least one of silicon oxide ($SiO_x$), silicon nitride ($SiN_x$) or silicon oxynitride ($SiO_xN_y$) are stacked each other or multiple layers in which the inorganic layers are alternately stacked each other, but are not limited thereto. The buffer layer BL, the first gate insulating layer GI, the first interlayer insulating layer IL1, and the first passivation layer PV1 may be made of an inorganic layer including the insulating material described above. Also, in some embodiments, the first interlayer insulating layer IL1 may be made of an organic insulating material such as polyimide (PI).

A fourth conductive layer may be disposed on the first passivation layer PV1. The fourth conductive layer may include a floating electrode FE. The floating electrode FE may be an electrode of an island shaped pattern, to which no voltage is applied. For example, the floating electrode FE may be electrically floated.

The floating electrode FE is illustrated as being disposed in the fourth conductive layer, but is not limited thereto. In some embodiments, the floating electrode FE may be disposed in any one of the first to third conductive layers.

A via layer VIA may be disposed on the fourth conductive layer in the display area DPA. The via layer VIA may include an organic insulating material such as polyimide (PI) to form a flat upper surface while compensating for a step difference caused by the lower conductive layers. However, in some embodiments, the via layer VIA may be omitted.

The display device 10 may include bank patterns BP1 and BP2, multiple electrodes RME (RME1 and RME2), a bank layer BNL, multiple light emitting elements ED, and multiple connection electrodes CNE (CNE1 and CNE2) as display element layers disposed on the via layer VIA. The display device 10 may include insulating layers PAS1, PAS2 and PAS3, which are disposed on the via layer VIA.

The bank patterns BP1 and BP2 may be disposed on the via layer VIA. For example, the bank patterns BP1 and BP2 may be directly disposed on the via layer VIA, and may have a structure in which at least a portion is protruded on the upper surface of the via layer VIA. The protruded portion of the bank patterns BP1 and BP2 may have a side inclined or curved with a predetermined (or selectable) curvature, and light emitted from the light emitting element ED may be reflected by the electrodes RME disposed on the bank patterns BP1 and BP2 and then emitted toward an upper direction of the via layer VIA. Unlike the shown embodiment, an outer surface of the bank patterns BP1 and BP2 in a cross-sectional view may have a shape curved with a predetermined (or selectable) curvature, for example, a semi-circular, or semi-elliptical shape. The bank patterns BP1 and BP2 may include, but are not limited to, an organic insulating material such as polyimide (PI).

The electrodes RME (RME1 and RME2) may be disposed on the bank patterns BP1 and BP2 and the via layer VIA. For example, the first electrode RME1 and the second electrode RME2 may be disposed on the inclined sides of the bank patterns BP1 and BP2. The first electrode RME1 may be disposed on the via layer VIA positioned between the bank patterns BP1 and BP2. The second electrode RME2 may not be disposed on the via layer VIA positioned between the bank patterns BP1 and BP2. A width of the electrodes RME, which is measured in the second direction DR2, may be smaller than that of the bank patterns BP1 and BP2, which is measured in the second direction DR2. A distance between the first electrode RME1 and the second electrode RME2, which are spaced apart from each other in the second direction DR2, may be narrower than that of the bank patterns BP1 and BP2. At least a portion of the first electrode RME1 and the second electrode RME2 may be disposed directly on the via layer VIA and may be disposed on the same plane.

According to an embodiment of the disclosure, a spaced area SP (or a gap space) that spaces the first electrode RME1 and the second electrode RME2 apart from each other may be disposed between the first electrode RME1 and the second electrode RME2. The spaced area SP may be formed by removing or passing through at least a portion of the electrodes RME1 and RME2. For example, after the electrodes RME1 and RME2 is deposited on the bank patterns BP1 and BP2 and the via layer VIA, the electrode disposed in the spaced area SP may be etched to be separated into the first electrode RME1 and the second electrode RME2. A portion of the via layer VIA and the bank pattern BP1 and BP2 may be exposed by the spaced area SP.

For example, the spaced area SP may be formed on the right side of the light emitting element ED. The spaced area SP may be disposed to be adjacent to the second bank pattern BP2 rather than the first bank pattern BP1. The spaced area SP may expose at least a portion of the via layer VIA and a side of the second bank pattern BP2.

The light emitting elements ED disposed between the bank patterns BP1 and BP2 may emit light in both end directions and the emitted light may be directed toward the electrode RME disposed on the bank patterns BP1 and BP2. Each electrode RME may have a structure in which a portion disposed on the bank patterns BP1 and BP2 may reflect the light emitted from the light emitting element ED. The first electrode RME1 and the second electrode RME2 may be disposed to cover the sides of the bank patterns BP1 and BP2 to reflect the light emitted from the light emitting element ED.

The respective electrodes RME may be directly in contact with the third conductive layer through the electrode contact holes CTD and CTS in a portion overlapped the bank layer BNL between the light emission area EMA and the sub-area SA. The first electrode contact hole CTD may be formed in an area where the bank layer BNL and the first electrode RME1 overlap each other, and the second electrode contact hole CTS may be formed in an area where the bank layer BNL and the second electrode RME2 overlap each other. The first electrode RME1 may be in contact with the first conductive pattern CDP1 through the first electrode contact hole CTD that passes through the via layer VIA and the first passivation layer PV1. The second electrode RME2 may be in contact with the second voltage line VL2 through the second electrode contact hole CTS that passes through the via layer VIA and the first passivation layer PV1. The first electrode RME1 may be electrically connected to the first transistor T1 through the first conductive pattern CDP1 to allow the first power voltage to be applied thereto, and the second electrode RME2 may be electrically connected to the second voltage line VL2 to allow the second power voltage to be applied thereto, but the electrodes are not limited thereto. In other embodiment, the respective electrodes RME1 and RME2 may not be electrically connected to the voltage lines VL1 and VL2 of the third conductive layer or the connection electrode CNE that will be described later may be directly connected with the third conductive layer.

The electrodes RME may include a conductive material having high reflectance. For example, the electrodes RME may include a metal such as silver (Ag), copper (Cu) and aluminum (Al) or an alloy containing aluminum (Al), nickel (Ni), lanthanum (La), etc. or may have a structure in which a metal layer such as titanium (Ti), molybdenum (Mo), and niobium (Nb) and the alloy are stacked each other. In some embodiments, the electrodes RME may be a double layer or multiple layers in which an alloy containing aluminum (Al)

and at least one metal layer of titanium (Ti), molybdenum (Mo) or niobium (Nb) are stacked each other.

Without limitation to the above embodiment, each of the electrodes RME may further include a transparent conductive material. For example, each electrode RME may include a material such as ITO, IZO and ITZO. In some embodiments, each of the electrodes RME may have a structure in which one or more layers of a transparent conductive material and a metal layer having high reflectance are stacked each other or may be formed as a single layer including the transparent conductive material and a metal having high reflectance. For example, each electrode RME may have a stacked structure such as ITO/Ag/ITO/, ITO/Ag/IZO or ITO/Ag/ITZO/IZO. The electrodes RME may be electrically connected to the light emitting elements ED and may reflect some of the light emitted from the light emitting elements ED to an upper direction of the first substrate SUB.

According to an embodiment, the spaced area SP that spaces the electrodes RME apart from each other may be disposed to toward one side without being disposed at the center between the bank patterns BP1 and BP2, whereby a proportion of the light emitted from the light emitting element ED to a lower portion may be minimized. For example, the spaced area SP may be disposed toward to the second bank pattern BP2 and disposed to be adjacent to one end of the light emitting element ED, and the first electrode RME1 overlaps the center of the light emitting element ED, so that the light emitted from the light emitting element ED to the lower portion may be reflected toward the upper direction. This will be described in detail with reference to other drawings.

The first insulating layer PAS1 may be disposed on the entire surface of the display area DPA and may be disposed on the via layer VIA and the electrodes RME. The first insulating layer PAS1 may be disposed to fill the spaced area SP formed by the electrodes RME. The first insulating layer PAS1 may include an insulating material to protect the electrodes RME and mutually insulate the different electrodes RME. The first insulating layer PAS1 may be disposed to cover the electrodes RME before the bank layer BNL is formed, thereby preventing the electrodes RME from being damaged in the process of forming the bank layer BNL. The first insulating layer PAS1 may prevent the light emitting element ED disposed thereon from being damaged due to direct contact with other members.

The first insulating layer PAS1 may include contact portions CT1 and CT2 disposed in the sub-area SA. The contact portions CT1 and CT2 may be disposed to overlap respective electrodes. For example, the contact portions CT1 and CT2 may include a first contact portion CT1 disposed on the first electrode RME1 and a second contact portion CT2 disposed to overlap the second electrode RME2. The first contact portion CT1 and the second contact portion CT2 may expose a portion of an upper surface of the first electrode RME1 or the second electrode RME2 by passing through the first insulating layer PAS1. Each of the first contact portion CT1 and the second contact portion CT2 may further pass through a portion of other insulating layers disposed on the first insulating layer PAS1. The electrodes exposed by the respective contact portions CT1 and CT2 may be in contact with the connection electrodes CNE.

As described below, the first insulating layer PAS1 may be stepped such that a portion of an upper surface is recessed in a portion overlapped the first electrode RME1 or the upper surface thereof may be fully removed. The area where the first insulating layer PAS1 is fully or partially exposed may form a strong electric field in accordance with an electrical signal.

The bank layer BNL may be disposed on the first insulating layer PAS1. The bank layer BNL may include a portion extended in the first direction DR1 and the second direction DR2 and may surround each of the subpixels SPXn. The bank layer BNL may distinguish the light emission area EMA from the sub-area SA while surrounding the light emission area EMA and the sub-area SA of each subpixel SPXn and may distinguish the display area DPA from the non-display area NDA while surrounding the outermost periphery of the display area DPA.

The bank layer BNL may have a predetermined (or selectable) height similar to the bank patterns BP1 and BP2. In some embodiments, an upper surface of the bank layer BNL may be higher than the bank patterns BP1 and BP2 and its thickness may be equal to or greater than that of the bank patterns BP1 and BP2 in the third direction DR3. The bank layer BNL may prevent ink from overflowing to the adjacent subpixel SPXn in an inkjet printing process of a manufacturing process of the display device 10. The bank layer BNL may include an organic insulating material such as polyimide in the same manner as the bank patterns BP1 and BP2.

The light emitting elements ED may be disposed in the light emission area EMA. The light emitting elements ED may be disposed on the first insulating layer PAS1 between the bank patterns BP1 and BP2. The light emitting element ED2 may be disposed such that a portion extended in one direction is to be parallel with the upper surface of the first substrate SUB. As described below, the light emitting elements ED may include multiple semiconductor layers disposed along the extended direction, and the semiconductor layers may be sequentially disposed along a direction parallel with the upper surface of the first substrate SUB, but the disclosure is not limited thereto. In case that the light emitting element ED has another structure, the semiconductor layers may be disposed in a direction perpendicular to the first substrate SUB.

The light emitting elements ED disposed in the respective subpixels SPXn may emit light having different wavelength bands depending on the material of the semiconductor layer, but are not limited thereto. The light emitting elements ED disposed in the respective subpixels SPXn may include semiconductor layers of the same material to emit light of the same color.

The light emitting elements ED may be in contact with the connection electrodes CNE and thus electrically connected to the conductive layers below the electrodes RME and the via layer VIA and may emit light of a specific wavelength band as an electrical signal is applied thereto.

The second insulating layer PAS2 may be disposed on the light emitting elements ED, the first insulating layer PAS1, and the bank layer BNL. The second insulating layer PAS2 may include a pattern portion extended in the first direction DR1 between the bank patterns BP1 and BP2 and disposed on the light emitting elements ED. The pattern portion may be disposed to partially surround an outer surface of the light emitting element ED and may not cover both sides or both ends of the light emitting element ED. The pattern portion may form a linear or island shaped pattern within each subpixel SPXn in the plan view. The pattern portion of the second insulating layer PAS2 may protect the light emitting elements ED and may fix the light emitting elements ED in the manufacturing process of the display device 10. A portion of the second insulating layer PAS2 may be disposed on the bank layer BNL and in the sub-areas SA.

The second insulating layer PAS2 may include contact portions CT1 and CT2 disposed in the sub-area SA. The second insulating layer PAS2 may include a first contact portion CT1 disposed to overlap the first electrode RME1 and a second contact portion CT2 disposed to overlap the second electrode RME2. The contact portions CT1 and CT2 may also pass through the second insulating layer PAS2 in addition to the first insulating layer PAS1. Each of the first and second contact portions CT1 and CT2 may expose a portion of an upper surface of the first electrode RME1 or the second electrode RME2.

The connection electrodes CNE (CNE1 and CNE2) may be disposed on the electrodes RME and the bank patterns BP1 and BP2. The first connection electrode CNE1 may be disposed on the first electrode RME1 and the first bank pattern BP1. The first connection electrode CNE1 may be extended from the light emission area EMA to the sub-area SA beyond the bank layer BNL while partially overlapping the first electrode RME1. In an embodiment, the second connection electrode CNE2 may be disposed on the second electrode RME2, the second bank pattern BP2, and the first electrode RME1. The second connection electrode CNE2 may be extended from the light emission area EMA to the sub-area SA beyond the bank layer BNL while partially overlapping the first electrode RME1 and the second electrode RME2.

Each of the first and second connection electrodes CNE1 and CNE2 may be disposed on the second insulating layer PAS2 and may be in contact with the light emitting elements ED. The first connection electrode CNE1 may partially overlap the first electrode RME1 and may be in contact with a first end of the light emitting elements ED. The second connection electrode CNE2 may partially overlap the second electrode RME2 and may be in contact with a second end of the light emitting elements ED. The connection electrodes CNE may be disposed over the light emission area EMA and the sub-area SA. The connection electrodes CNE may be in contact with the light emitting elements ED in a portion disposed in the light emission area EMA and may be electrically connected to the third conductive layer in a portion disposed in the sub-area SA.

According to an embodiment, in the display device 10, the respective connection electrodes CNE may be in contact with the electrode RME through the contact portions CT1 and CT2 disposed in the sub-area SA. The first connection electrode CNE1 may be in contact with the first electrode RME1 in the sub-area SA through the first contact portion CT1 that passes through the first insulating layer PAS1, the second insulating layer PAS2, and the third insulating layer PAS3. The second connection electrode CNE2 may be in contact with the second electrode RME2 in the sub-area SA through the second contact portion CT2 that passes through the first insulating layer PAS1 and the second insulating layer PAS2. The respective connection electrodes CNE may be electrically connected to the third conductive layer through the respective electrodes RME. The first connection electrode CNE1 may be electrically connected to the first transistor T1 to allow the first power voltage to be applied thereto, and the second connection electrode CNE2 may be electrically connected to the second voltage line VL2 to allow the second power voltage to be applied thereto. The respective connection electrodes CNE may be in contact with the light emitting element ED in the light emission area EMA to transfer the power voltage to the light emitting element ED, but are not limited thereto.

In some embodiments, the connection electrodes CNE may be directly in contact with the third conductive layer and may be electrically connected with the third conductive layer through other patterns other than the electrode RME.

The connection electrodes CNE may include a conductive material. For example, the connection electrodes CNE may include ITO, IZO, ITZO, Al, etc. For example, the connection electrode CNE may include a transparent conductive material and light emitted from the light emitting element ED may be emitted by transmitting the connection electrode CNE.

The third insulating layer PAS3 may be disposed on the second connection electrode CNE2 of a first connection electrode layer and the second insulating layer PAS2. The third insulating layer PAS3 may be disposed entirely on the second insulating layer PAS2 to cover the second connection electrode CNE2, and the first connection electrode CNE1 of a second connection electrode layer may be disposed on the third insulating layer PAS3. The third insulating layer PAS3 may insulate the first connection electrode CNE1 and the second connection electrode CNE2 from each other such that the first connection electrode CNE1 and the second connection electrode CNE2 are not directly in contact with each other.

The third insulating layer PAS3 may include the first contact portions CT1 disposed in the sub-area SA. The first contact portions CT1 may also pass through the third insulating layer PAS3 in addition to the first insulating layer PAS1 and the second insulating layer PAS2. The first contact portions CT1 may expose a portion of the upper surface of the first electrode RME1.

Although not shown in the drawing, another insulating layer may be further disposed on the third insulating layer PAS3 and the first connection electrode CNE1. The additional insulating layer may serve to protect the members disposed on the first substrate SUB from an external environment.

Each of the first insulating layer PAS1, the second insulating layer PAS2, and the third insulating layer PAS3 may include an inorganic insulating material or an organic insulating material. For example, each of the first insulating layer PAS1, the second insulating layer PAS2, and the third insulating layer PAS3 may include an inorganic insulating material or the first insulating layer PAS1 and the third insulating layer PAS3 may include an inorganic insulating material but the second insulating layer PAS2 may include an organic insulating material. Each or at least one of the first insulating layer PAS1, the second insulating layer PAS2, and the third insulating layer PAS3 may be formed in a structure in which multiple insulating layers are alternately or repeatedly stacked each other. In an embodiment, each of the first insulating layer PAS1, the second insulating layer PAS2, and the third insulating layer PAS3 may include any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material or a portion of the first insulating layer PAS1, the second insulating layer PAS2, and the third insulating layer PAS3 may be made of the same material and another portion thereof may be made of different materials, or each of the first to third insulating layers may be made of materials different from one another.

FIG. 5 is a schematic view illustrating a light emitting element according to an embodiment of the disclosure.

Referring to FIG. 5, the light emitting element ED may be a light emitting diode and specifically, the light emitting element ED may be an inorganic light emitting diode made of an inorganic material with a size of a nano-meter to a micro-meter. The light emitting element ED may be aligned between two electrodes having polarities when an electric field is formed in a specific direction between the two electrodes facing each other.

The light emitting element ED according to an embodiment may have a shape extended in one direction. The light emitting element ED may have a cylindrical shape, a rod shape, a wire shape, or a tube shape, but is not limited thereto. The light emitting element ED may have a polygonal pillar shape such as a cube, a cuboid, and a hexagonal pillar or may have various shapes such as a shape extended in one direction, having an external surface that is partially inclined.

The light emitting element ED may include a semiconductor layer doped with any conductivity type (e.g., p-type or n-type) impurities. The semiconductor layer may emit light of a specific wavelength band as an electrical signal applied from an external power source is transferred thereto. The light emitting element ED may include a first semiconductor layer 31, a second semiconductor layer 32, a light emitting layer 36, an electrode layer 37, and an insulating layer 38.

The first semiconductor layer 31 may be an n-type semiconductor. The first semiconductor layer 31 may include a semiconductor material having a formula of $Al_xGa_yIn_{1-x-y}N$ ($0 \leq x \leq 1$, $0 \leq y \leq 1$, $0 \leq x+y \leq 1$). For example, the first semiconductor layer 31 may include any one or more of AlGaInN, GaN, AlGaN, InGaN, AlN and InN, which are doped with n-type dopants. The n-type dopants doped in the first semiconductor layer 31 may be Si, Ge, Sn, Se, etc.

The second semiconductor layer 32 may be disposed on the first semiconductor layer 31 with the light emitting layer 36 interposed therebetween. The second semiconductor layer 32 may be a p-type semiconductor and may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may include any one or more of AlGaInN, GaN, AlGaN, InGaN, AlN and InN, which are doped with p-type dopants. The p-type dopants doped in the second semiconductor layer 32 may be Mg, Zn, Ca, Ba, etc.

The first semiconductor layer 31 and the second semiconductor layer 32 are shown as being formed of a single layer in FIG. 5, but are not limited thereto. The first semiconductor layer 31 and the second semiconductor layer 32 may include more than one layer, such as a clad layer or a tensile strain barrier reducing (TSBR) layer, depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may include any one or more of AlGaInN, GaN, AlGaN, InGaN, AlN, InN and SLs doped with n-type dopants. The semiconductor layer disposed between the second semiconductor layer 32 and the light emitting layer 36 may include one or more of AlGaInN, GaN, AlGaN, InGaN, AlN and InN doped with p-type dopants.

The light emitting layer 36 may be disposed between the first semiconductor layer 31 and the second semiconductor layer 32. The light emitting layer 36 may include a single or multiple quantum well structure material. In case that the light emitting layer 36 includes a material of a multiple quantum well structure, multiple quantum layers and multiple well layers may be alternately stacked each other. The light emitting layer 36 may emit light by combination of electron-hole pairs in accordance with electrical signals applied through the first semiconductor layer 31 and the second semiconductor layer 32. The light emitting layer 36 may include a material such as AlGaN, AlGaInN, and InGaN. In case that the light emitting layer 36 has a stacked structure of quantum layers and well layers, which are alternately stacked each other in a multiple quantum well structure, the quantum layer may include a material such as AlGaN or AlGaInN and the well layer may include a material such as GaN or AlInN.

The light emitting layer 36 may have a structure in which a semiconductor material having a big band gap energy and semiconductor materials having a small band gap energy are alternately stacked each other and may include group-III or group-V semiconductor materials depending on a wavelength band of light that is emitted. The light emitting layer 36 may emit light of a red or green wavelength band, without being limited to light of a blue wavelength band.

The electrode layer 37 may be an ohmic connection electrode, but is not limited thereto. The electrode layer 37 may be a Schottky connection electrode. The light emitting element ED may include at least one electrode layer 37. The light emitting element ED may include one or more electrode layers 37, but is not limited thereto. The electrode layer 37 may be omitted.

The electrode layer 37 may reduce resistance between the light emitting element ED and an electrode or a connection electrode in case that the light emitting element ED is electrically connected with the electrode or the connection electrode in the display device 10. The electrode layer 37 may include a metal having a conductivity. For example, the electrode layer 37 may include at least one of Al, Ti, In, Au, Ag, ITO, IZO, and ITZO.

The insulating layer 38 may be disposed to surround outer surfaces of the semiconductor layers and electrode layers. For example, the insulating layer 38 may be disposed to surround at least an outer surface of the light emitting layer 36 and may be formed to expose both ends in a length direction of the light emitting element ED. Also, the insulating layer 38 may be formed with a rounded upper surface on a section in an area adjacent to at least one end of the light emitting element ED or may have a semi-circular or semi-elliptical shape.

The insulating layer 38 may include materials having insulation property, for example, at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$) or titanium oxide ($TiO_x$). The insulating layer 38 is illustrated as being formed of a single layer in FIG. 6, but is not limited thereto. In some embodiments, the insulating layer 38 may be formed of a multi-layered structure in which multiple layers are stacked each other.

The insulating layer 38 may serve to protect the semiconductor layers and the electrode layers of the light emitting element ED. The insulating layer 38 may prevent an electrical short that may occur in the light emitting layer 36 in case that the light emitting element ED is directly in contact with the electrode to which the electrical signal is transferred. The insulating layer 38 may prevent light emitting efficiency of the light emitting element ED from being deteriorated.

In an embodiment, the light emitting element ED may have a first end E1 in which the electrode layer 37 is disposed and a second end E2 in which the first semiconductor layer 31 is disposed, wherein the second end E2 faces the first end E1 in the second direction DR2.

FIG. 6 is an enlarged schematic cross-sectional view illustrating a portion where a light emitting element is disposed in an embodiment of the disclosure. FIG. 7 is enlarged schematic cross-sectional view illustrating a portion where a light emitting element is disposed in another embodiment of the disclosure.

Referring to FIGS. 6 and 7, the first end E1 of the light emitting element ED may be disposed to be adjacent to the first bank pattern BP1, and the second end E2 thereof may be disposed to be adjacent to the second bank pattern BP2. The light emitting element ED may be disposed in a shape extended in the second direction DR2 in the display device 10. In the display device 10, the first electrode RME1 and the second electrode RME2 may be disposed to be spaced apart from each other in the second direction DR2 with the spaced area SP interposed therebetween, and the semiconductor layers 31 and 32, the light emitting layer 36, and the electrode layer 37 of the light emitting element ED may be sequentially disposed in the second direction DR2. In more detail, the electrode layer 37, the second semiconductor layer 32, the light emitting layer 36, and the first semiconductor layer 31 of the light emitting element ED may be sequentially formed in the second direction DR2.

The spaced area SP may be formed to space the first electrode RME1 and the second electrode RME2 apart from each other. The spaced area SP may be disposed toward one side of the bank patterns BP1 and BP2. For example, the spaced area SP may be disposed toward the second bank pattern BP2. The spaced area SP may expose at least a portion of a side of the second bank pattern BP2 and an upper surface of the via layer VIA. The spaced area SP may be disposed on a right side from the center of the light emitting element ED.

The first electrode RME1 of the electrodes RME1 and RME2 separated by the spaced area SP may have one end disposed on the upper surface of the via layer VIA, and the second electrode RME2 may have one end disposed on the side of the second bank pattern BP2. According to the embodiment, a shortest distance H1 between the lower surface of the via layer VIA (or first substrate SUB) and the end of the first electrode RME1 may be shorter than a shortest distance H2 between the lower surface of the via layer VIA (or first substrate SUB) and the end of the second electrode RME2.

The first insulating layer PAS1 may be disposed on the via layer VIA and the electrodes RME, and may be disposed to fill the spaced area SP formed by the electrodes RME. The first insulating layer PAS1 may be directly in contact with the side of the second bank pattern BP2 and the upper surface of the via layer VIA. Although it is illustrated that a step difference of the first insulating layer PAS1 does not exist in the spaced area SP in FIG. 6, it is not limited thereto. In some embodiments, the first insulating layer PAS1 may be stepped so that a portion of the upper surface may be recessed in the spaced area SP.

The first insulating layer PAS1 may include an opening formed in an area where the upper surface is partially or fully removed at a portion overlapped the first electrode RME1. For example, the first insulating layer PAS1 may include a first opening OP1 where the upper surface of the first insulating layer PAS1 is partially removed and a side and the upper surface of the first insulating layer PAS1 are exposed. The first opening OP1 may be disposed toward the first bank pattern BP1, and may be disposed on a left side from the center of the light emitting element ED unlike the spaced area SP. Therefore, an electric field of a portion of the first electrode RME1 overlapped the first opening OP1 through which the first insulating layer PAS1 is exposed may be enhanced during an alignment process of the light emitting element ED, which will be described later. The light emitting element ED may be aligned at the center of the light emission area EMA by the enhanced electric field at the portion of the first electrode RME1 and an electric field of one end of the second electrode RME2 adjacent to the spaced area SP.

The first end E1 of the light emitting element ED may be disposed to be adjacent to the first opening OP1, and may be disposed on the first electrode RME1. The first end E1 of the light emitting element ED may be disposed to be adjacent to the first electrode RME1 to which the high potential voltage (or first power voltage) is applied, and the second end E2 may be disposed to be adjacent to the second electrode RME2 to which the low potential voltage (or second power voltage) is applied. For example, referring to FIG. 6, the first end E1 may overlap the first electrode RME1 and the first opening OP1. The electrode layer 37 corresponding to the first end E1 may overlap the first opening OP1. In another embodiment, referring to FIG. 7, the first end E1 may overlap the first electrode RME1 without overlapping the first opening OP1.

The second end E2 of the light emitting element ED may be disposed to be adjacent to the spaced area SP. The second end E2 may not overlap the first electrode RME1 and the second electrode RME2. For example, referring to FIG. 6, the second end E2 may be disposed in the spaced area SP. For example, the first semiconductor layer 31 corresponding to the second end E2 may be disposed in the spaced area SP. In another embodiment, referring to FIG. 7, the second end E2 may be disposed on the first electrode RME1.

Most of the semiconductor layers of the light emitting element ED may overlap the first electrode RME1. The second semiconductor layer 32, the light emitting layer 36, and the first semiconductor layer 31 of the light emitting element ED may partially overlap the first electrode RME1. The center of the light emitting element ED may overlap the first electrode RME1. In the embodiment, a first distance L1 between the first end E1 of the light emitting element ED and one end of the first electrode RME1 may be longer than a second distance L2 between the second end E2 and the end of the first electrode RME1.

The floating electrode FE disposed on the first passivation layer PV1 may be formed in an area at least partially overlapping the spaced area SP. The floating electrode FE may prevent the light emitting element ED from being aligned to be inclined toward the right side without being aligned at the center due to a strong electric field formed between one end of the first electrode RME1 and one end of the second electrode RME2. For example, the floating electrode FE may weaken the electric field formed between one end of the first electrode RME1 and one end of the second electrode RME2.

The first connection electrode CNE1 may be in contact with the first end E1 of the light emitting element ED on the first insulating layer PAS1, and the second connection electrode CNE2 may be in contact with the second end E2 of the light emitting element ED. The first connection electrode CNE1 may overlap the first electrode RME1, and may be disposed in the first opening OP1. The second connection electrode CNE2 may overlap the first electrode RME1 and the second electrode RME2, and may overlap the spaced area SP.

FIG. 8 is a schematic cross-sectional view illustrating a light emitting direction of a light emitting element in an embodiment. FIG. 8 schematically shows that light is emitted from the light emitting element ED of the display device 10.

Referring to FIG. 8, emission light emitted from the light emitting element ED may be generated in the light emitting layer 36 of the light emitting element ED and may be emitted in a random direction. A first emission light EL1 of the emission light may be directed upward by passing through the insulating layer 38, the second insulating layer PAS2, the connection electrodes CNE1 and CNE2, and the third insulating layer PAS3 in the light emitting layer 36. Another portion of the emission light may be emitted to both ends of the light emitting element ED and may be directed toward the electrodes RME1 and RME2 on the bank patterns BP1 and BP2.

A second emission light EL2 and a third emission light EL3 of the emission light may be emitted to the lower portion of the light emitting element ED. The second emission light EL2 may be directed toward the first substrate SUB by passing through the insulating layer 38 of the light emitting element ED. In the embodiment, since the spaced area SP is disposed to be distanced from the light emitting layer 36 of the light emitting element ED, the light amount of the second emission light EL2 emitted from the light emitting element ED and directed toward the first substrate SUB may be reduced. For example, a proportion of the light emitted to the lower portion may be minimized.

The third emission light EL3 may be emitted in a lower direction of the light emitting element ED and then reflected by the first electrode RME1. Since the first electrode RME1 serves as a reflective electrode that reflects incident light, the third emission light EL3 incident on the first electrode RME1 may be reflected by the first electrode RME1 and emitted upward. For example, as the first electrode RME1 disposed at the center of the bank patterns BP1 and BP2 performs the function of the reflective electrode, a recycling effect of the light emitted in the lower direction may be achieved.

As the spaced distance between the light emitting element ED and the reflective electrode is close, light emitting efficiency in the upper direction due to the recycling effect may be increased. For example, in case that the spaced distance between the light emitting element ED and the reflective electrode is within about 1 μm, the light emitting efficiency in the upper direction due to the recycling effect may be increased as much as about 10% or more as compared to the case that the spaced distance is about 1 μm or more. In an embodiment, since the spaced distance between the light emitting element ED and the first electrode RME1 may be within about 1 μm, the light emitting efficiency in the upper direction may be increased.

In short, the spaced area SP that spaces the electrodes RME1 and RME2 apart from each other may not be disposed at the center of the light emitting element ED but be disposed toward one end, whereby the proportion of the light emitted from the light emitting element ED to the lower portion may be minimized. For example, the spaced area SP may be disposed to be adjacent to the second end E2 of the light emitting element ED, and may be disposed to be distanced from the light emitting layer 36. The first electrode RME1 may overlap most area of the light emitting element ED including the light emitting layer 36 of the light emitting element ED. Therefore, in the emission light emitted from the light emitting element ED, the amount of light emitted to the lower portion of the first substrate SUB may be reduced, and the light emitted to the lower portion may be reflected to the upper direction by the first electrode RME1.

The display device 10 may reduce loss of light emitted in the lower direction, and may improve light emitting efficiency in the upper direction.

FIG. 9 is enlarged schematic cross-sectional view illustrating a portion where a light emitting element is disposed in another embodiment of the disclosure.

In the display device 10 according to the embodiment of the disclosure, the first opening OP1 may be formed to completely remove the upper surface of the first insulating layer PAS1 in some areas. The first opening OP1 may expose the side of the first insulating layer PAS1 and the upper surface of the first electrode RME1. The first connection electrode CNE1 may be directly in contact with the first electrode RME1 of which upper surface is exposed.

FIG. 10 is a schematic cross-sectional view illustrating a process of aligning a light emitting element and an electric field, which are formed in first and second electrodes in an embodiment of the disclosure. FIG. 10 schematically illustrates an electric field formed between the first electrode and the second electrode by applying an electrical signal to the first electrode RME1 and the second electrode RME2.

Generally, a density of the electric field may be the highest at the end (or edge) of the electrode. For example, the electric field of the highest density may be formed at one end of the first electrode RME1 and one end of the second electrode RME2.

The floating electrode FE may weaken the electric field generated at one end of the electrodes RME1 and RME2. The floating electrode FE may be formed at a portion overlapping the spaced area SP in the thickness direction to weaken the strong electric field formed between one end of the first electrode RME1 and one end of the second electrode RME2. Therefore, the light emitting element ED may be prevented from being aligned to be inclined toward one side (e.g., right side) without being seated on the center between the bank patterns BP1 and BP2 by the electric field.

The first opening OP1 that fully or partially exposes the first insulating layer PAS1 may enhance the electric field of the first electrode RME1 that overlaps the first opening OP1. Since the first opening OP1 may allow the first insulating layer PAS1 to be thin or remove the first insulating layer PAS1, the electric field of the first electrode RME1 may be increased in the corresponding portion. A central alignment electric field may be stably formed by the enhanced electric field of the upper surface of the first electrode RME1 covered by the first insulating layer PAS1 that is thin and the weakened electric field at one end of the second electrode RME1. The light emitting element ED may be seated at the center between the bank patterns BP1 and BP2 by the corresponding electric field, and may be prevented from being aligned to be inclined toward one side.

Hereinafter, display devices 10_1, 10_2 and 10_3 according to another embodiment will be described. In the following embodiment, the same reference numerals will be given to the same elements as those of the previous embodiment, and their redundant description will be omitted or simplified. The following description will be based on a difference from the previous embodiment.

FIG. 11 is a schematic cross-sectional view illustrating a display device according to another embodiment. FIG. 12 is an enlarged schematic cross-sectional view illustrating a portion where a light emitting element is disposed in another embodiment of the disclosure.

Referring to FIGS. 11 and 12, the display device 10_1 according to the embodiment is different from the display device of the previous embodiment in that the spaced area SP is formed only in the second bank pattern BP2 and the first insulating layer PAS1 further includes a second opening OP2 that exposes the upper surface of the second electrode RME2.

The spaced area SP may not be formed on the upper surface of the via layer VIA but be formed on the side of the second bank pattern BP2. A distance between the spaced area SP and the first opening OP1 may be longer than that of the previous embodiment. The first insulating layer PAS1 disposed to fill the spaced area SP may be in contact with the side of the second bank pattern BP2 without being in contact with the upper surface of the via layer VIA.

The electrodes RME1 and RME2 may be disposed to be spaced apart from the side of the second bank pattern BP2. The first electrode RME1 may be disposed to cover the entire upper surface of the via layer VIA in the light emission area EMA so that it is in contact with the second bank pattern BP2. The second electrode RME2 is in contact with the second bank pattern BP2, but may not be disposed on the upper surface of the via layer VIA.

The first insulating layer PAS1 may include a first opening OP1 and a second opening OP2. The first opening OP1 may be adjacent to the first end E1 of the light emitting element ED in the same manner as the previous embodiment, and may expose a portion of the upper surface and the side of the first insulating layer PAS1. The second opening OP2 may partially expose the second electrode RME2 disposed on the second bank pattern BP2 by passing through the first insulating layer PAS1. The second connection electrode CNE2 may be in contact with the second electrode RME2 exposed in the second opening OP2.

The light emitting element ED may completely overlap the first electrode RME1. The electrode layer 37, the second semiconductor layer 32, the light emitting layer 36, and the first semiconductor layer 31 of the light emitting element ED may completely overlap the first electrode RME1. The light emitting element ED may not overlap the second electrode RME2.

The connection electrodes CNE1 and CNE2 may be in contact with both ends of the light emitting element ED in the same manner as in the previous embodiment. For example, the first connection electrode CNE1 may be in contact with the first end E1, and the second connection electrode CNE2 may be in contact with the second end E2.

The floating electrode FE may partially overlap the spaced area SP, and may partially overlap the first electrode RME1. The floating electrode FE may weaken the electric field formed between one end of the first electrode RME1 and one end of the second electrode RME1. In the embodiment, the floating electrode FE may weaken the electric field between the upper surface of the first electrode RME1 and one end of the second electrode RME2 to align the light emitting element ED at the center.

In the embodiment, in order to prevent the light emitting element ED from failing to be disposed at the center of the light emission area EMA as the electric field between the upper surface of the first electrode RME1 and one end of the second electrode RME2 is weakened by the floating electrode FE, the second opening OP2 for exposing the upper surface of the second electrode RME2 may be provided. The electric field of the upper surface of the second electrode RME2 exposed by the second opening OP2 may be enhanced, and a central alignment electric field of the light emitting element ED may be formed between the upper surface of the second electrode RME2 and the upper surface of the first electrode RME1.

In the display device 10_1 according to the embodiment, the spaced area SP may be disposed toward one side of the light emitting element ED, whereby loss of light emitted in the lower direction of the first substrate SUB may be reduced, and light emitting efficiency in the upper direction may be improved. The light emitting element ED of the display device 10_1 may be aligned at the center (or central portion between the bank patterns BP1 and BP2) of the light emission area EMA by adjusting the electric field between the first electrode RME1 and the second electrode RME2.

FIG. 13 is a schematic cross-sectional view illustrating a display device according to still another embodiment of the disclosure. FIG. 14 is an enlarged schematic cross-sectional view illustrating a portion where a light emitting element is disposed in still another embodiment of the disclosure.

Referring to FIGS. 13 and 14, the display device 10_2 according to the embodiment is the same as the display device of the embodiment of FIGS. 6 to 9 in that the spaced area SP is formed in the via layer VIA and the second bank pattern BP2, one end of the first electrode RME1 is disposed on the upper surface of the via layer VIA, and one end of the second electrode RME2 is disposed on the side of the second bank pattern BP2. In the embodiment, the first insulating layer PAS1 may further include a third opening OP3 that exposes a portion of the upper surface of the first electrode RME1, in addition to a second opening OP2 that exposes a portion of the upper surface of the second electrode RME2.

The first insulating layer PAS1 may include a first opening OP1, a second opening OP2, and a third opening OP3. The first opening OP1 may be adjacent to the first end E1 of the light emitting element ED in the same manner as the previous embodiment, and may expose a portion of the upper surface and the side of the first insulating layer PAS1. The second opening OP2 may partially expose the second electrode RME2 disposed on the second bank pattern BP2 by passing through the first insulating layer PAS1. The second connection electrode CNE2 may be in contact with the second electrode RME2 exposed in the second opening OP2. The third opening OP3 may partially expose the first electrode RME1 disposed on the first bank pattern BP1 by passing through the first insulating layer PAS1. The first connection electrode CNE1 may be in contact with the first electrode RME1 exposed in the third opening OP3.

In the display device 10_2 according to the embodiment, the spaced area SP may be disposed toward one side of the light emitting element ED, whereby loss of light emitted in the lower direction of the first substrate SUB may be reduced, and light emitting efficiency in the upper direction may be improved. The light emitting element ED of the display device 10_2 may be aligned at the center (or central portion between the bank patterns BP1 and BP2) of the light emission area EMA by adjusting the electric field between the first electrode RME1 and the second electrode RME2.

FIG. 15 is a schematic cross-sectional view illustrating a display device according to further still another embodiment of the disclosure. FIG. 16 is an enlarged schematic cross-sectional view illustrating a portion where a light emitting element is disposed in further still another embodiment of the disclosure.

Referring to FIGS. 15 and 16, the display device 10_3 according to the embodiment is different from the display device of the previous embodiment in that the spaced area SP is formed only in the second bank pattern BP2, and a portion of the first electrode RME1 is disposed between the via layer VIA (or first substrate SUB) and the second bank pattern BP2. In the embodiment, instead of the floating electrode FE, a portion of the first electrode RME1 may serve to weaken an electric field.

The spaced area SP may not be formed on the upper surface of the via layer VIA but may be formed on the side of the second bank pattern BP2. The first insulating layer PAS1 disposed to fill the spaced area SP may be in contact with the side of the second bank pattern BP2 without being in contact with the upper surface of the via layer VIA in the light emission area EMA.

The first electrode RME1 may include a portion disposed between the via layer VIA and the second bank pattern BP2. A portion of the first electrode RME1 may be in contact with the lower surface of the second bank pattern BP2. The first electrode RME1 may overlap a portion of the second electrode RME2 in the thickness direction of the first substrate SUB.

In the embodiment, the first electrode RME1 may weaken the electric field formed in the spaced area SP. Therefore, the light emitting element ED may be aligned at the center of the bank patterns BP1 and BP2 without being aligned to be inclined toward one side.

In the display device 10_3 according to the embodiment, the spaced area SP may be disposed toward one side of the light emitting element ED, whereby loss of light emitted in the lower direction of the first substrate SUB may be reduced, and light emitting efficiency in the upper direction may be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
    a first electrode and a second electrode disposed on a substrate, the first electrode and the second electrode being spaced apart from each other with a spaced area disposed between the first electrode and the second electrode;
    an insulating layer disposed on the first electrode and the second electrode, the insulating layer filling the spaced area; and
    a light emitting element disposed on the insulating layer and having a first end disposed on the first electrode and a second end opposite to the first end, wherein
    the insulating layer comprises a first opening adjacent to the first end of the light emitting element and exposing the insulating layer,
    the spaced area is disposed to be adjacent to the second end of the light emitting element,
    wherein the first opening overlaps a first end of the light emitting element in a thickness direction, the first end of the light emitting element is a side surface of the light emitting element that is perpendicular to a longitudinal direction of the light emitting element, and
    wherein the first electrode overlaps at least a center point of the light emitting element in a thickness direction of the substrate.

2. The display device of claim 1, further comprising:
    a floating electrode disposed between the substrate and the first electrode in a thickness direction of the substrate and electrically floated.

3. The display device of claim 2, wherein the floating electrode overlaps the spaced area in the thickness direction of the substrate.

4. The display device of claim 1, wherein
    the light emitting element comprises:

an N-type semiconductor layer, a P-type semiconductor layer, and a light emitting layer disposed between the N-type semiconductor layer and the P-type semiconductor layer, and the N-type semiconductor layer is disposed on the second end of the light emitting element.

5. The display device of claim 1, wherein the second end of the light emitting element does not overlap the second electrode in a thickness direction of the substrate.

6. The display device of claim 5, wherein the second end of the light emitting element overlaps the first electrode in the thickness direction of the substrate.

7. The display device of claim 5, wherein the second end of the light emitting element overlaps the spaced area in the thickness direction of the substrate.

8. The display device of claim 1, wherein the first opening exposes an upper surface of the insulating layer.

9. The display device of claim 1, wherein the first opening exposes a side of the insulating layer and the first electrode.

10. The display device of claim 1, further comprising:

a first bank pattern disposed between the substrate and the first electrode; and a second bank pattern disposed between the substrate and the second electrode, wherein the spaced area exposes a portion of the second bank pattern, and the insulating layer is in contact with the second bank pattern.

11. The display device of claim 10, wherein an end of the second electrode is disposed on the second bank pattern.

12. The display device of claim 1, further comprising:

a first connection electrode that is in electrical contact with the first end of the light emitting element on the insulating layer; and a second connection electrode that is in electrical contact with the second end of the light emitting element on the insulating layer.

13. The display device of claim 12, wherein a portion of the second connection electrode overlaps a portion of the first electrode in a thickness direction of the substrate.

14. The display device of claim 12, wherein the insulating layer further comprises a second opening exposing an upper surface of the second electrode, and the second connection electrode is in electrical contact with the exposed upper surface of the second electrode.

15. The display device of claim 14, wherein the insulating layer further comprises a third opening exposing an upper surface of the first electrode, and the first connection electrode is in electrical contact with the exposed upper surface of the first electrode.

16. The display device of claim 1, wherein a portion of the first electrode overlaps a portion of the second electrode in a thickness direction of the substrate.

17. An electronic device comprising:

a first electrode and a second electrode disposed to be spaced apart from each other on a substrate;

an insulating layer disposed on the first electrode and the second electrode; and a light emitting element disposed on the insulating layer and having a first end disposed on the first electrode and a second end opposite to the first end, wherein the insulating layer comprises a first opening adjacent to the first end of the light emitting element and exposing the insulating layer, wherein a distance between the first end of the light emitting element and an end of the first electrode in a plan view is longer than a distance between the second end of the light emitting element and the end of the first electrode in a plan view, wherein the first opening overlaps a first end of the light emitting element in a thickness direction, the first end of the light emitting element is a side surface of the light emitting element that is perpendicular to a longitudinal direction of the light emitting element, and wherein the first electrode overlaps at least a center point of the light emitting element in a thickness direction of the substrate.

18. The electronic device of claim 17, further comprising:

a first bank pattern disposed between the substrate and the first electrode; and a second bank pattern disposed between the substrate and the second electrode, wherein an end of the second electrode is disposed on the second bank pattern.

19. The electronic device of claim 17, wherein a shortest distance between the substrate and the first electrode is shorter than a shortest distance between the substrate and the second electrode.

* * * * *